US011144228B2

(12) United States Patent
Martinelli et al.

(10) Patent No.: US 11,144,228 B2
(45) Date of Patent: Oct. 12, 2021

(54) CIRCUIT PARTITIONING FOR A MEMORY DEVICE

(71) Applicant: Micron Technology, Inc., Boise, ID (US)

(72) Inventors: Andrea Martinelli, Bergamo (IT); Christophe Vincent Antoine Laurent, Agrate Brianza (IT); Claudio Nava, Cornate d'Adda (IT); Marco Defendi, Sulbiate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/508,729

(22) Filed: Jul. 11, 2019

(65) Prior Publication Data

US 2021/0011645 A1    Jan. 14, 2021

(51) Int. Cl.
*G06F 3/06* (2006.01)
*G11C 11/22* (2006.01)
(Continued)

(52) U.S. Cl.
CPC .......... *G06F 3/0644* (2013.01); *G06F 3/0604* (2013.01); *G06F 3/0683* (2013.01);
(Continued)

(58) Field of Classification Search
CPC .............. G11C 11/221; G11C 11/2253; G11C 11/2273; G11C 11/4087; G11C 11/4091;
(Continued)

(56) References Cited

U.S. PATENT DOCUMENTS 9,792,958 B1* 10/2017 Laurent .............. H01L 27/0207
2009/0070721 A1* 3/2009 Solomon ........... H01L 27/11807
716/118
(Continued)

FOREIGN PATENT DOCUMENTS

KR       20150028727 A       3/2015

OTHER PUBLICATIONS

ISA/KR, International Search Report and written Opinion of the International Searching Authority, Int'l Appl. No. PCT/US2020/035889, Sep. 17, 2020, Korean Intellectual Property Office, Seo-gu, Daejeon, Republic of Korea, 9 pgs.
(Continued)

*Primary Examiner* — Sung Il Cho
(74) *Attorney, Agent, or Firm* — Holland & Hart LLP

(57) ABSTRACT

Methods, systems, and devices for circuit partitioning for a memory device are described. In one example, a memory device may include a set of memory tiles that each include a respective array of memory cells (e.g., in an array level or layer). Each of the memory tiles may include a respective circuit level or layer associated with circuitry configured to operate the respective array of memory cells. The memory device may also include circuitry for communicating data between the memory cells of the set of memory tiles and an input/output component. Aspects of the circuitry for communicating the data may be subdivided into repeatable blocks each configured to communicate one or more bits, and the repeatable blocks and other aspects of the circuitry for communicating the data is distributed across the circuit layer of two or more of the set of memory tiles.

25 Claims, 9 Drawing Sheets

(51) Int. Cl.
  *G11C 29/52* (2006.01)
  *G11C 11/4091* (2006.01)
  *G06F 11/10* (2006.01)
  *G11C 11/408* (2006.01)
(52) U.S. Cl.
  CPC ........ *G06F 11/1068* (2013.01); *G11C 11/221* (2013.01); *G11C 11/2253* (2013.01); *G11C 11/2273* (2013.01); *G11C 11/4087* (2013.01); *G11C 11/4091* (2013.01); *G11C 29/52* (2013.01)
(58) Field of Classification Search
  CPC ..... G11C 29/52; G06F 3/0644; G06F 3/0604; G06F 3/0683; G06F 11/1068
  USPC .......................................................... 365/145
  See application file for complete search history.

(56) References Cited

U.S. PATENT DOCUMENTS

| | | | | |
|---|---|---|---|---|
| 2010/0091537 | A1* | 4/2010 | Best | H01L 25/0657 365/51 |
| 2010/0165692 | A1* | 7/2010 | Jeddeloh | G11C 11/4097 365/51 |
| 2014/0098608 | A1* | 4/2014 | Barkley | G11C 16/10 365/185.11 |
| 2016/0291896 | A1* | 10/2016 | Musoll | G06F 9/5016 |
| 2016/0300816 | A1* | 10/2016 | Park | H01L 25/18 |
| 2017/0228192 | A1* | 8/2017 | Willcock | G06F 3/0673 |
| 2017/0294229 | A1 | 10/2017 | Sumino et al. | |
| 2017/0322749 | A1* | 11/2017 | Qawami | G06F 12/0646 |
| 2017/0352397 | A1* | 12/2017 | Guo | G11C 11/2275 |
| 2018/0232275 | A1* | 8/2018 | Casper | G06F 11/1076 |
| 2018/0301188 | A1* | 10/2018 | Choi | G11C 5/066 |
| 2018/0374557 | A1 | 12/2018 | Jeddeloh | |
| 2019/0103139 | A1 | 4/2019 | Laurent | |
| 2019/0156893 | A1 | 5/2019 | Lee | |
| 2019/0377632 | A1* | 12/2019 | Oh | G06F 11/1048 |
| 2020/0006299 | A1* | 1/2020 | Liu | H01L 23/49816 |
| 2020/0144242 | A1* | 5/2020 | Park | H01L 25/18 |
| 2020/0194452 | A1* | 6/2020 | Xiao | H01L 27/1157 |
| 2020/0303344 | A1* | 9/2020 | Manipatruni | H01L 25/0655 |

OTHER PUBLICATIONS

IPO, "Office Action," issued in connection with ROC (Taiwan) Patent Application No. 109119281, dated Apr. 26, 2021 (8 pages).

* cited by examiner

CIRCUIT PARTITIONING FOR A MEMORY DEVICE

BACKGROUND

The following relates generally to a system that includes at least one memory device and more specifically to circuit partitioning for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Some memory devices may include circuitry associated with input, output, and other operations for exchanging or interpreting information of various memory cells. Memory devices may have various constraints for locating such circuitry in a memory die.

DETAILED DESCRIPTION

Figure 1:
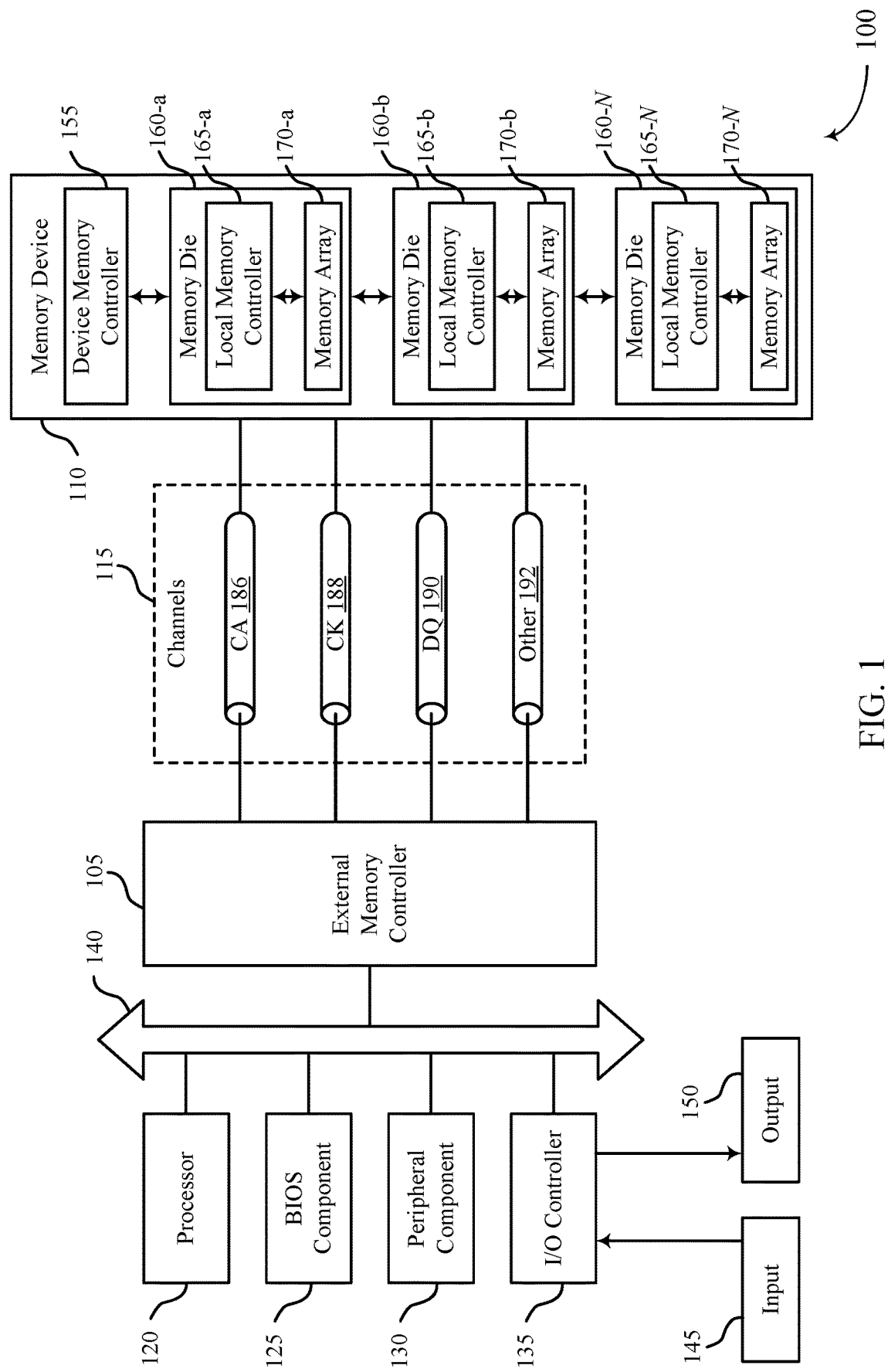
FIG. 1 illustrates an example of a system that supports circuit partitioning for a memory device in accordance with examples as disclosed herein.

Systems and techniques related to circuit partitioning for a memory device are described. Some memory devices may include circuitry associated with input, output, and other operations for exchanging or interpreting information of various memory cells. Such circuitry may be referred to as data path circuitry, and may support operations such as signal amplification, redundancy, error correction, or others. In some examples, such circuitry may correspond to a quantity of bits for access operations (e.g., a quantity of bits for data transfer, a quantity of bits for parallel or other coordinated accessing of multiple memory cells, a quantity of bits corresponding to an access strobe command or a page activation command), and may be shared across a set of memory cells (e.g., according to a component selection or multiplexing scheme). In some examples, such circuitry, or portions thereof, may be repeated for each set of memory cells of a plurality of sets, and may be distributed across various portions of a memory die.

Memory devices may have various constraints for locating data path circuitry in a memory die. Such constraints may be related to relative sizes of memory cells, memory arrays, and circuit components of data path circuitry, and other geometric considerations. Additionally or alternatively, such constraints may be related to interconnection requirements, power supply accessibility or consumption requirements, signal integrity or noise constraints, and others.

In accordance with the techniques disclosed herein, a memory device may include data path circuitry that is distributed in particular portions of a memory die. For example, a memory device (e.g., a memory die) may include a plurality of memory tiles (e.g., patches), where each of the memory tiles includes an array layer and a circuit layer. For each memory tile, the array layer may include a plurality of memory cells and the circuit layer may include circuitry corresponding to operating the plurality of memory cells of the array layer, such as decoding circuitry, multiplexing circuitry, driver circuitry, sensing circuitry, or other circuitry that is specific to the memory tile. The memory device may also include data path circuitry that is shared by the plurality of memory tiles (e.g., corresponding to operating the plurality of memory tiles, corresponding to data exchange between the plurality of memory tiles and an input/output component), and is distributed across the circuit layer of two or more memory tiles of the plurality of memory tiles (e.g., all of the plurality of memory tiles, a subset of the plurality of memory tiles). Thus, in some examples, a memory device may include various types of circuitry that are distributed across circuit layers of a plurality of memory tiles, where tile-specific circuitry is included in the circuit layer of a corresponding memory tile, and data path circuitry is distributed across the remaining space of the circuit layer of at least some of the memory tiles (e.g., in space of the circuit layers not occupied by tile-specific circuitry).

Features of the disclosure are initially described in the context of a memory system and memory die as described with reference to FIGS. 1 and 2. Features of the disclosure are further described and illustrated in the context of layouts for memory tiles, memory sections, and data paths with references to FIGS. 3 through 9.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. In some cases, the host device may transmit, to the memory device 110, an access command associated with data for a first memory section. The first memory section may include a respective set of subarrays (e.g., tiles, patches) of the memory device 110. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed on the first memory section based on operating the first set of circuitry and the second set of circuitry. Such a pattern of sections, shared circuitry, and driver borrowing may be repeated across any number of memory sections. The host device may receive the data for the first subarray or tile based on coupling a first sense component, or portion thereof, with a first I/O line or bus and a second sense component, or portion thereof, with a second I/O line or bus.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some cases, the components of the system 100 (e.g., a memory device 110) may include sense components, I/O buses or lines, drivers, or shunts, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may include multiple memory sections and memory tiles as described herein. A memory array 170 may be a collection (e.g., a grid) of memory cells, with each memory cell being configured to store at least one bit of digital data. Features of memory arrays 170 and/or memory cells are described in more detail below, including with reference to FIG. 2.

In various examples, a device memory controller 155 of a memory device 110, or one or more local memory controllers 165 of a memory device 110, may be considered as or perform operations associated with an input/output component of the memory device 110 (e.g., for communication of information associated with access commands). In some examples, the memory device 110 may receive an access command associated with data of the memory device 110. In some cases, the memory device 110 may receive (e.g., prior to receiving the access command) an activation command that indicates an address range (e.g., a range of column addresses) for the access command as corresponding to only a subset of subarrays within a bank of the memory device. In some cases, the memory device 110 may also receive (e.g., prior to receiving the activation command) a command to operate the memory device 110 according to a power mode or configuration, such as a reduced power mode. When operating in the reduced power mode, the memory device 110 may be configured to activate only the indicated subset of the subarrays within the target bank (and to leave deactivated other subarrays within the target bank). The memory device 110 may thus, while executing the access operation on one portion of the target bank, place in or otherwise maintain in a deactivated mode other portions of the target bank, thereby conserving power, among other benefits.

In some examples, the memory device 110 may receive an access command associated a first memory section of the memory device 110. The first memory section may be located between a second memory section and a third memory section. The device memory controller 155 may be coupled with sets of drivers and provide control signals to each set of drivers for sets of shared circuitry common to respective memory sections. For example, a first set of circuitry may be shared by the first memory section and the second memory section using drivers associated with the first memory section and drivers associated with the second memory section. A second set of circuitry shared by the first memory section and the third memory section using drivers associated with the first memory section and drivers associated with the third memory section. An access operation may be performed associated with data for the first section based at least in part on operating the first set of circuitry and operating the second set of circuitry.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, or software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

The components of the system 100 may exchange information with the memory device 110 using a plurality of channels 115. In some examples, the channels 115 may enable communications between the external memory controller 105 and the memory device 110. Each channel 115 may include one or more signal paths or transmission media (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (e.g., including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any number of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a memory die 160 may include one or memory arrays 170, and a memory array 170 may include a plurality of memory tiles. In some cases, memory tiles within a memory array 170 may be organized into groups for concurrent access, and such groups may be referred to as banks or sections. In some cases, memory tiles may be organized into rows and columns within the memory array 170, which may, in some cases, be referred to as a quilt architecture, and a row of the memory array 170 may be a section. Each of the memory tiles may include an array layer and a circuit layer. For each memory tile, the array layer may include a plurality of memory cells (e.g., a subarray, a portion of a memory array 170) and the circuit layer may include circuitry corresponding to (e.g., dedicated to, specific to, primarily assigned to) the plurality of memory cells of the array layer, such as decoding circuitry, multiplexing circuitry, driver circuitry, sensing circuitry, or other circuitry that is specific to the memory tile (though, in some cases, circuitry that is specific to the memory tile may be accessible by one or more neighboring tiles via multiplexing or other switching circuitry, along with one or more interconnections). The memory device may also include data path circuitry that is shared by the plurality of memory tiles (e.g., corresponding to operating the bank of memory tiles, corresponding to data exchange between the bank of memory tiles and a local memory controller 165, available to multiple memory tiles and selectively used for one or more of the multiple memory tiles at a time), and is distributed across the circuit layer of two or more memory tiles of the plurality of memory tiles (e.g., the circuit layers of all of the plurality of memory tiles, the circuit layers of a subset of the plurality of memory tiles). In some cases, sets of shared circuitry may include sets of data path circuitry configured to transfer information associated with access operations for memory cells in a respective first memory section and for memory cells in a respective second memory section. Thus, in some examples, a memory die 160 may include various types of circuitry that are distributed across circuit layers of a plurality of memory tiles, where tile-specific circuitry is included in the circuit layer of a corresponding memory tile, and data path circuitry (e.g., bank-specific circuitry) is distributed across remaining space of the circuit layer of the memory tiles (e.g., in spaces of the circuit layers not occupied by tile-specific circuitry). In some examples, one or more local I/O lines may be shared between memory tiles, which may support various techniques for selectively activating and deactivating (e.g., maintaining as deactivated) subsets of memory tiles to support various page size modes or reduced power modes.

Figure 2:
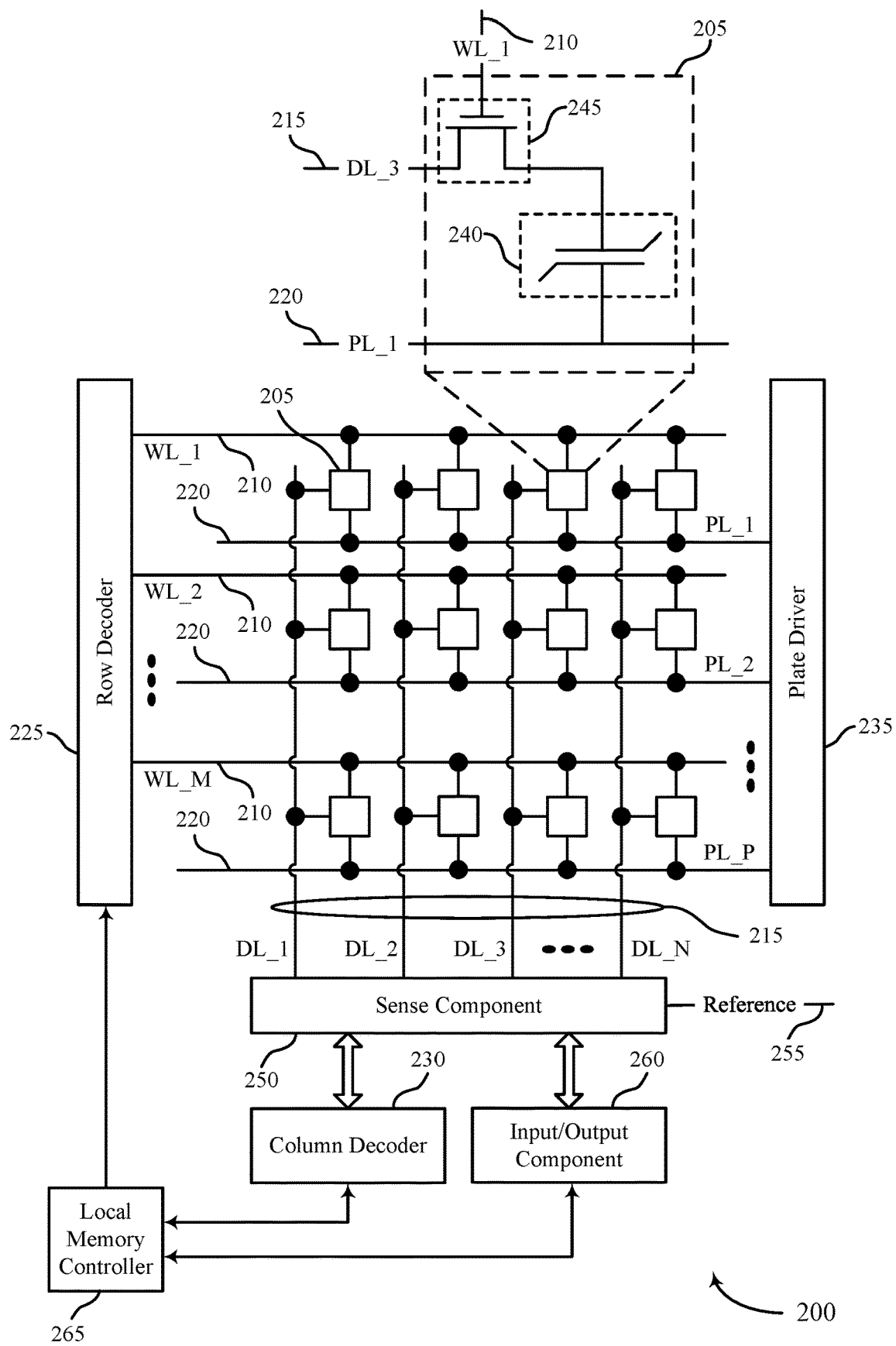
FIG. 2 illustrates an example of a memory die that supports circuit partitioning for a memory device in accordance with examples as disclosed herein.

FIG. 2 illustrates an example of aspects of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 and a logic 1). In some cases, a single memory cell 205 (e.g., a multi-level memory cell) may be configured to store more than one bit of information at a time (e.g., a logic 00, logic 01, logic 10, or a logic 11). In some examples, the memory cells 205 of the memory die 200 may include a plurality of memory sections, where each of the sections includes or otherwise corresponds to a plurality of tiles or patches.

A memory cell 205 may store a state (e.g., polarization state or dielectric charge) that represents digital data. In FeRAM architectures, the memory cell 205 may include a capacitor 240 that includes a ferroelectric material to store a charge and/or a polarization representative of the programmable state. In DRAM architectures, the memory cell 205 may include a capacitor 240 that includes a dielectric material to store a charge representative of the programmable state. In other memory architectures, a memory die 200 in accordance with the described techniques may implement other types of memory elements or storage elements. For example, a memory die 200 may include memory cells 205 with a configurable material memory element (e.g., in place of the illustrated capacitor 240) that stores a logic state as a material property of the material memory element. Such material properties may include a programmable resistance (e.g., for a phase change material memory element that can be programmed with different resistances, in a PCRAM application), a programmable threshold voltage (e.g., for a material memory element that can be programmed with different threshold voltages, such as by write operations with different current pulse duration, amplitude, or polarity), and other characteristics that can be selectively programmed to store a logic state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

A memory device that includes the memory die 200 may receive an access command (e.g., from a host device). In some cases, an access command may indicate an address range for the access command as corresponding to a first subarray of the memory die 200. In such cases, the access command may be associated with data for the first subarray. The sense component 250, or portions thereof, may be coupled with components of the memory die 200 based on receiving the access command and sense logic states stored by memory cells 205.

In some cases, an access command may indicate an address range for the access command as corresponding to one or more subarrays of the memory die 200 (e.g., as corresponding to a memory section of the memory die 200). In such cases, the access command may be associated with data for the memory section. A host device may transmit an access command associated with data for a first memory section. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed based on operating the first set and the second set of circuitry. The sense component 250, or portions thereof, may be coupled with the first set of circuitry and the second set of circuitry based on receiving the access command and sense logic states stored by memory cells.

The memory cell 205 may include a logic storage component, such as capacitor 240 or other storage element or memory element (e.g., a configurable material), and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. However, in various examples, memory architectures that support the described techniques may or may not include a switching component 245 as part of, or otherwise associated with a respective memory cell 205. In some cases, plate lines 220 may be coupled with a cell plate reference voltage, such as Vpl, or may be a ground or chassis ground voltage, such as Vss. In some cases, plate lines 220 may refer to a plate or electrical node that is common to all of the memory cells 205, or a plate or electrical node that is common to a subset of the memory cells 205 or a subset of plate lines, or another electrical node coupled with a plate line driver.

Selecting or deselecting the memory cell 205 may be accomplished by activating or deactivating the switching component 245, or otherwise activating relevant access lines. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation may be controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be relatively small, in some cases. As such, the sense component 250 may include one or more sense amplifiers to amplify the signal output of the memory cell 205. The sense amplifiers may detect small changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output component 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The sense component 250 may include any number of sense amplifiers. A sense amplifier may be configured to sense data from a respective memory tile as well as one or more neighbor memory tile. For example, the sense amplifier may be included in a circuit layer of the respective memory tile, and may be configured to be coupled with memory cells in an array layer of the respective memory tile, but (e.g., via multiplexing or other switching circuitry or interconnections) may also be configured to be coupled with memory cells included in an adjacent memory tile, where the adjacent memory tile may be in the same section or a different section than the respective memory tile. For example, the sense component 250, or a portion thereof, may be configured to sense data from a first subarray of the memory die 200 or a second subarray of the memory die 200 based on an activation command that indicates an address range for the access command as corresponding to the first subarray or the second subarray. In such cases, the sense component 250 may be activated. In some cases, the sense component 250 may be deactivated based on the access command corresponding to the first subarray or the second subarray of the memory die 200.

The detected logic state of the memory cell 205 may be provided as an output of the sense component 250 (e.g., to an input/output component 260), which may be used to indicate the detected logic state to another component of a memory device 110 that includes the memory die 200, such as a device memory controller 155 (e.g., directly or using the local memory controller 265). The input/output component 260, or other component between the sense component 250 and the input/output component 260, may include various components or circuitry that support the communication of information between memory cells 205 (e.g., by way of the sense component 250, sense amplifiers of the sense component 250) and the local memory controller 265. Such components or circuitry may be referred to as data path circuitry, and may support operations such as signal amplification, redundancy, error detection, error correction, and other operations.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform or control a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform or control a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 (e.g., a sense amplifier of the sense component 250) may amplify the signal. The local memory controller 265 may fire the sense component 250 (e.g., latch a sense amplifier of the sense component 250) and thereby compare the signal received from the memory cell 205 to the reference signal 255. Based on that comparison, the sense component 250 may determine a logic state that is stored on the memory cell 205. In some examples, the local memory controller 265 may communicate the logic state stored on the memory cell 205 to an external memory controller 105 or a device memory controller 155 as part of the read operation. In some examples, other operations may be performed between sensing a logic state of a memory cell 205 and communicating information to or from an external memory controller 105 or device memory controller 155 (e.g., by the input/output component 260), such as signal amplification, redundancy operations, or error correction operations.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some examples, the memory die 200 may include a plurality of memory tiles or patches, where each of the memory tiles of the memory die 200 includes an array layer and a circuit layer. For each memory tile, the array layer may include a plurality of memory cells 205 and the circuit layer may include circuitry corresponding to (e.g., dedicated to, specific to, primarily assigned to) the plurality of memory cells of the array layer, such as decoding circuitry, sensing circuitry, or other circuitry that is specific to the memory tile (e.g., of a row decoder 225, of a column decoder 230, of a sense component 250). The memory device may also include data path circuitry (e.g., of an input/output component 260, of a local memory controller 265) that is shared by the plurality of memory tiles and is distributed across the circuit layer of two or more memory tiles of the plurality of memory tiles. Thus, in some examples, the memory die 200 may include various types of circuitry that are distributed across circuit layers of a plurality of memory tiles, where tile-specific circuitry is included in the circuit layer of a corresponding memory tile, and data path circuitry (e.g., bank-specific circuitry) is distributed across the memory tiles (e.g., in space of the circuit layer not occupied by tile-specific circuitry).

Figure 3:
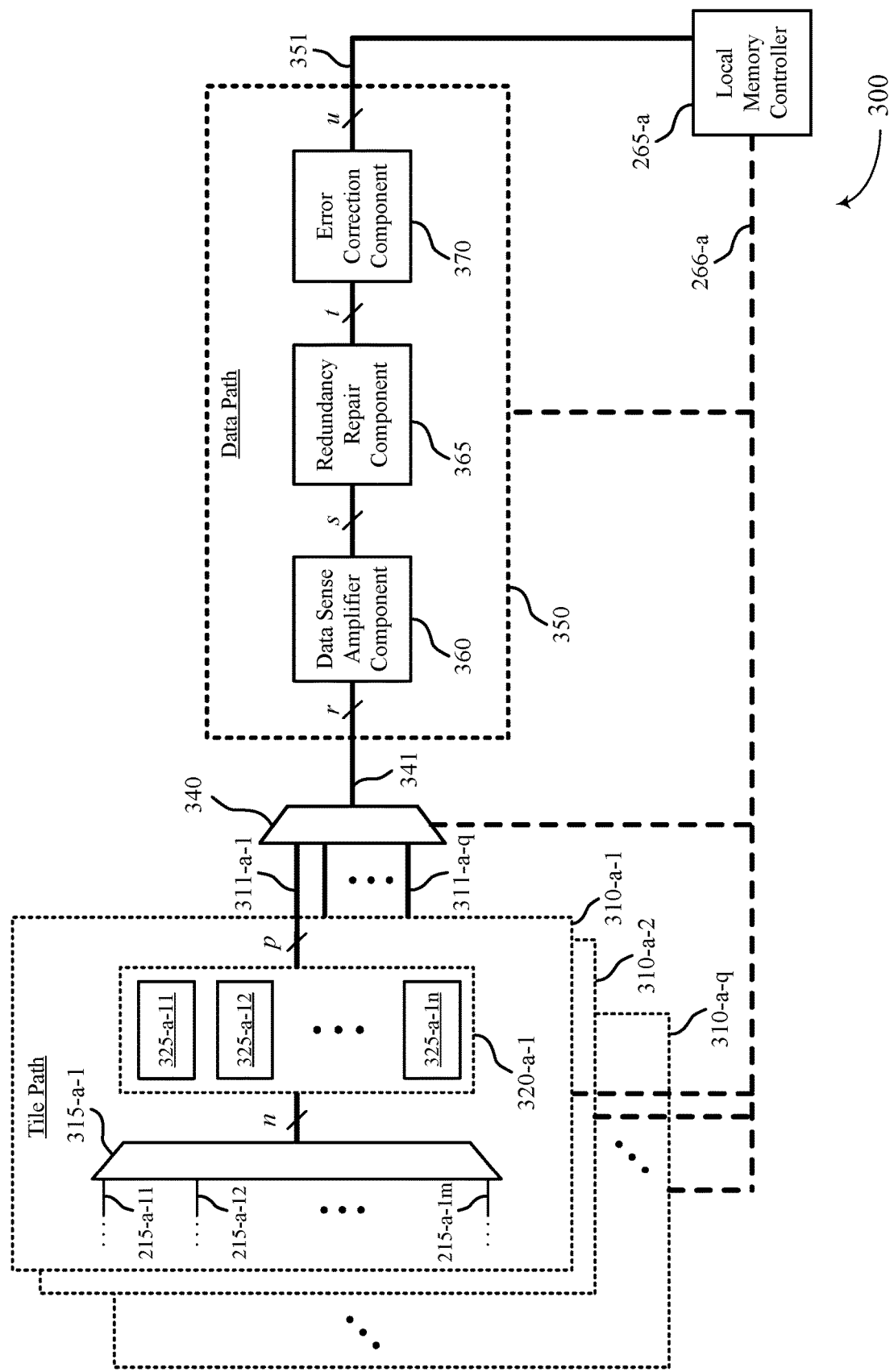
FIG. 3 illustrates an example of a memory layout that that supports circuit partitioning for a memory device in accordance with examples as disclosed herein.

FIG. 3 illustrates an example of a memory layout 300 that supports circuit partitioning for a memory device in accordance with examples as disclosed herein. The memory layout 300 may be included in or otherwise illustrate aspects of a memory die, such as a memory die 160 described with reference to FIG. 1 or a memory die 200 described with reference to FIG. 2. The memory layout 300 illustrates an example where a set of tile paths 310 (e.g., tile paths 310-a-1 through 310-a-q) may be selectively coupled with a data path 350 using a tile multiplexer 340.

The data path 350 may be communicatively coupled with a local memory controller 265-a over a data path bus 351 (e.g., a data bus) to support various access operations described herein (e.g., read operations, write operations, rewrite operations, refresh operations, exchanging data or information with a host of a memory device that includes the memory layout 300). In some examples, the data path 350, the tile multiplexer 340, or both may be considered to be included in an input/output component (e.g., an input/output component 260 described with reference to FIG. 2), or the data path 350 may be considered to be in communication between an array of memory cells 205 and an input/output component. In some examples, circuitry or operations related to information transfer with a memory array may be associated with the local memory controller 265-a, and the data path 350 may be an example of circuitry configured to process data or information communicated between the memory array and the local memory controller 265-a (e.g., where the local memory controller 265-a is part of, or otherwise performs functions related to an input/output of a memory device). In some examples, the local memory controller 265-a may be configured to control timing (e.g., timing of sense amplifier arrays 320-a, timing of sense amplifiers 325-a) or triggering of various operations or components of the tile paths 310, tile multiplexer 340, and the data path 350, which may include control signaling conveyed over a control bus 266-a, having one or more signal paths, that is shared or otherwise corresponds to all of the tile paths 310-a-1 through 310-a-q and the data path 350 (e.g., shared by a memory section or memory bank associated with the tile paths 310-a-1 through 310-a-q).

In the example of memory layout 300, interconnections between components are illustrated by buses (e.g., data buses, control buses) that may support multiple bits of information transfer. For example, the data path bus 351 may be associated with u bits of data transfer between the data path 350 and the local memory controller 265-a. In some examples, a quantity of bits of data transfer associated with a bus of the memory layout 300 may correspond to a number of discrete conductive signal paths (e.g., traces, wires, lines). For example, the data path bus 351 may be associated with u individual conductors or conductive traces between the data path 350 and the local memory controller 265-a. In other examples, components that communicate over a bus in the memory layout 300 may support a multi-level communication scheme, a multi-symbol communication scheme, a burst communication scheme, or some other signal modulation scheme that supports a particular quantity of bits of data transfer. For example, when the data path 350 and the local memory controller 265-s support a multi-symbol modulation scheme (e.g., a PAM3 scheme, a PAM4 scheme), the data path bus 351 may have fewer than u discrete signal paths to support the communication of u bits of data transfer. Although aspects of the buses of the memory layout 300 may be described with reference to a read operation or a write operation, buses of the memory layout 300 may be bidirectional buses that, in some examples, support both read operations and write operations. Accordingly, each end of a given bus of the memory layout 300 may be configured with a signal receiver, or a signal driver, or both a signal receiver and a signal driver.

The tile paths 310-a may be illustrative of circuit paths that support conveying, multiplexing, modifying, or otherwise processing signals between memory cells 205 (not shown) of a particular memory tile and the data path 350. In some examples, each of the tile paths 310-a may include or otherwise be associated with a unique or dedicated array of memory cells 205 that correspond to the respective tile path 310 or memory tile (e.g., a subarray of memory cells 205, memory cells 205 located in an array layer of the memory tile). Each of the tile paths 310-a may also be associated with a corresponding tile bus 311-a that is configured to convey one or more signals (e.g., carrying p bits of information) between the respective tile path 310-a and the tile multiplexer 340. In various examples, a tile bus 311 may be referred to as a local I/O bus or line of a memory tile or tile path 310-a or may refer to a set of more than one local I/O bus or line of a memory tile or tile path (e.g., where the respective tile bus 311-a is subdivided for various multiplexing or routing operations). Although certain details are illustrated with reference to the tile path 310-a-1, such details may be repeated in each of tile paths 310-a-2 through 310-a-q.

In the example of memory layout 300, each of the tile paths 310-a may include or otherwise correspond to a set of digit lines 215-a (e.g., digit lines 215-a-11 through 215-a-1m of tile path 310-a-1, a set of m digit lines 215-a), which may be examples of the digit lines 215 described with reference to FIG. 2. For example, each of the digit lines 215-a of the tile path 310-a-1 may be coupled with a respective switching component 245 of each of a set of memory cells 205 (e.g., a column of memory cells 205 of or corresponding to the tile path 310-a-1), where the respective switching component 245 may be configured to selectively couple a storage element of the memory cell 205 (e.g., a capacitor 240, a material memory element, another type of memory storage element) with the digit line 215-a. Accordingly, each of the memory cells 205 of or corresponding to the tile path 310-a-1 may be coupled with one of the digit lines 215-a-11 through 215-a-1m. In various examples, such a coupling between memory cells 205 and a digit line 215-a may be a direct coupling (e.g., directly along a conductive path or access line), or an indirect coupling (e.g., via circuit components or signal processing circuitry). For example, a digit line 215-a may include or otherwise be associated with signal development circuitry such as an amplifier, a cascode, a charge transfer sensing amplifier (CTSA), an amplification capacitor, and others.

For each of the tile paths 310-a, a row of memory cells 205 of the tile path 310-a may be selected or selectively activated by activating a word line 210 (not shown) that is included in the tile path 310-a, or otherwise corresponds to the tile path 310-a (e.g., is included in the memory tile corresponding to the tile path 310-a). For example, activating a word line 210 of or corresponding to the tile path 310-a-1 may couple a row or page of capacitors 240, material memory elements, or other type of memory storage elements, of respective memory cells 205 with a respective one of the digit lines 215-a-11 through 215-a-1m. In various examples, tile paths 310 may or may not include drivers, buffers, or multiplexers (e.g., a row decoder 225, or portion thereof, as described with reference to FIG. 2) to selectively activate word lines 210 or other selection lines.

For each of the tile paths 310-a, various ones of the set of m digit lines 215-a may be selectively coupled with or routed to a respective sense amplifier array 320-a of the tile path 310-a using a digit line multiplexer 315-a. For example, tile path 310-a-1 may include a sense amplifier array 320-a-1 having n sense amplifiers 325-a (e.g., sense amplifiers 325-a-11 through 325-a-1n). Thus, the digit line multiplexer 315-a-1 may be configured for selective coupling or mapping between m signal paths associated with digit lines 215-a-11 through 215-a-1m and n signal paths associated with the sense amplifier array 320-a-1 (e.g., n sense amplifiers 325-a). In some examples, the sense amplifier arrays 320-a may be considered to be included in, or otherwise refer to functions or circuitry of a sense component 250 described with reference to FIG. 2.

The sense amplifiers 325-a may include circuitry configured to latch a signal indicative of a logic state stored by a memory cell 205, such as sets of cross-coupled transistors that latch an output based on a comparison of a read signal from the memory cell 205 with a reference signal. In some examples, the sense amplifiers 325-a or some other portion of the sense amplifier array 320-a may include circuitry configured to generate or develop such read signals (e.g., based at least in part on a selective coupling with a memory cell 205) or generate or develop such reference signals. In some examples, the sense amplifiers 325-a may also be configured to generate or develop write signals to a digit line 215-a or a memory cell 205 (e.g., based at least in part on a write command of the local memory controller 265-a).

The digit line multiplexers 315-a, the sense amplifier arrays 320-a, and other circuitry corresponding to a given memory tile may be located in a circuit layer or level of a memory tile (e.g., a circuit level 450 of the memory tile 400, described with reference to FIG. 4), and the corresponding memory cells 205 of the memory tile may be located in an array layer or level of the memory tile (e.g., an array level 410 of the memory tile 400, described with reference to FIG. 4). In some cases, a circuit layer or level may be below (e.g., nearer to a substrate than) an array layer or level of the memory tile. In some cases, aspects of a line or bus as described herein (e.g., all or portions of a line or bus) may be located in a circuit layer or level of one or more memory tiles, a routing layer or level of one or more memory tiles (e.g., one or more metallization layers), a routing layer or level of a memory section or bank, or various combinations thereof. In various examples, an array layer or level may be between the circuit layer or level and one or more routing layers or levels. In some examples, one or more sockets (e.g., vias, conductive plugs) may provide interconnections between components at different layers or levels of a memory tile or memory bank. In some cases, sockets may be located between memory tiles within an array (e.g., in gaps between different memory tiles).

Control signal drivers that output control signals and control the timing signals of the sense amplifiers 325-a may also be located below an array level or layer of the memory tile (e.g., in a circuit level). In some cases, the control bus 266 or local memory controller 265 may provide inputs to one or more control signal drivers. In some cases, a set of drivers may be common to or otherwise correspond to a respective memory section of memory tiles and coupled to a set of shared circuitry by conductors (e.g., conductive lines, sockets). In some cases, the set of drivers may include drivers of a first type (e.g., configured to generate a first type or set of control signals) and drivers of a second type (e.g., configured to generate a second type or set of control signals). The drivers of the first type may be coupled with a first set of shared circuitry that is common to the respective memory section and a second memory section. The drivers of the second type may be coupled with a second set of shared circuitry that is common to the respective memory section and a third memory section. In some cases, the first set of shared circuitry includes a first set of sense amplifiers 325-a. A first subset of the first set of sense amplifiers 325-a underlies memory tiles of the respective memory section and a second subset of the first set of sense amplifiers 325-a underlies memory tiles of the second memory section. A second set of shared circuitry may include a second set of sense amplifiers 325-a. A first subset of the second set of sense amplifiers 325-a underlies memory tiles of the respective memory section and a second subset of the second set of sense amplifiers 325-a underlies memory tiles of the third memory section. Additionally or alternatively, the first set of shared circuitry may include data path circuitry shared by (borrowed between) memory tiles of the respective memory section and memory tiles of the second. memory section, and the second set of shared circuitry may include data path circuitry shared by (borrowed between) memory tiles of the respective memory section and memory tiles of the third memory section.

Each of the sense amplifiers 325-a may be configured to receive a signal from a respective memory cell 205 over a respective digit line 215-a according to a particular selection, mapping, or other configuration of the respective digit line multiplexer 315-a. For example, when the digit line multiplexer 315-a-1 is configured for coupling the sense amplifier array 320-a-1 with a subset of the digit lines 215-a-11 through 215-a-1m (e.g., a portion or subset of a row, a portion or subset of a page, when n<m), the digit line multiplexer 315-a-1 may receive a signal (e.g., from the local memory controller 265-a, over the control bus 266-a) to couple a particular subset of the digit lines 215-a-11 through 215-a-1m according to a particular access operation. In some examples, a memory layout may include a sense amplifier 325 for each of the digit lines 215 in a tile path 310 (e.g., where n=m), in which case a digit line multiplexer 315 may be omitted from the tile path 310.

The sense amplifier arrays 320-a (e.g., each of the sense amplifiers 325-a) may output signals indicative of the logic state stored by respective memory cells 205 (e.g., when performing functions of a read operation). In some examples, the output of a sense amplifier 325-a when reading a set of logic states that may be stored by the memory cells 205 may be associated with a relatively narrow or small voltage swing (e.g., a relatively small range of voltages for indicating the set of logic states, compared to a voltage swing used in a portion of or at an output of the data path 350). Using a relatively narrow voltage swing at the sense amplifiers 325-a may mitigate the risk of signal disturbance (e.g., due to capacitive or other cross-coupling or crosstalk) of concurrently transmitted signals or of data states stored in memory cells 205, and may also support corresponding components or circuitry occupying a relatively small area, or relatively thin dielectric separation between components or conductors of a tile path 310-a (e.g., between sense amplifiers 325-a, between conductive lines of a bus to or from a tile path 310-a, between memory cells 205), or relatively low charge accumulation or signal attenuation (e.g., related to capacitive loading such as intrinsic capacitance of access lines between a memory cell 205 and the data path 350), or relatively low charge leakage or power consumption in a tile path 310-a (e.g., related to charge leakage between components of the memory layout 300, related to charge leakage across portions meant to be electrically isolated by a dielectric portion, related to powering voltage sources or drivers for operating the memory layout 300).

In some examples, a sense amplifier array 320 may additionally include a sense amplifier selection component or multiplexer (not shown) which may be configured to select, enable, activate, latch, or route signals from a subset (e.g., fewer than all) of the sense amplifiers 325 of the sense amplifier array 320 (e.g., based on a column address associated with an access command). For example, such a selection component or multiplexer may select or activate half of the sense amplifiers 325 of the sense amplifier array 320, a quarter of the sense amplifiers 325 of the sense amplifier array 320, and so on (e.g., in response to signaling received from the control bus 266-a). When supporting read operations, for example, the output of such a sense amplifier array 320 may accordingly be configured to output fewer bits of data transfer than a number of sense amplifiers 325 in the sense amplifier array 320.

In some examples, a sense amplifier array 320 of one tile path 310, or a portion thereof, may be configured for a selective coupling with another tile path 310. In a partially-powered or partially-operational mode of a memory device, for example, the memory layout 300 may support a selective activation, deactivation, or idling of certain memory tiles or tile paths 310. In such examples, a sense amplifier array 320 or portion thereof (e.g., a subset of sense amplifiers 325) of a deactivated or idled memory tile may be shared, shunted, or otherwise coupled with an activated memory tile (e.g., an array of memory cells 205 of an activated memory tile, a sense amplifier array 320 of an activated memory tile). Thus, in some examples, a sense amplifier array 320 or a set of sense amplifiers 325 may be primarily dedicated to a certain memory tile or tile path 310, but, in some cases (e.g., certain operational modes), a sense amplifier array 320 or a set of sense amplifier 325 may be shared with another memory tile or tile path 310 (e.g., an adjacent memory tile or tile path 310). In other examples, a sense amplifier array 320 may be included in, or otherwise considered to be a part of a data path 350.

In some examples, a sense amplifier array 320, or another portion of a tile path 310, may include buffering functions or circuitry (e.g., a row buffer, a page buffer, a prefetch buffer). To support aspects of a read operation, for example, such a buffer may be configured to maintain or store signals corresponding to detected logic states that are not passed to the tile multiplexer 340 in a given operation (e.g., a subset of a row, a subset of a page). In various examples, such a buffering function may be configured to pass the stored signals to the tile multiplexer 340 at a later time or use such stored signals to support a write-back or rewrite command (e.g., rewriting a detected logic state to a memory cell 205).

Accordingly, in some examples, the side of a sense amplifier array 320 that is electrically coupled towards a data path 350 (e.g., coupled with a respective tile bus 311-*a*) may be configured to support a smaller number of bits of data transfer than the side of the sense amplifier array 320 that is electrically coupled towards digit lines 215 or memory cells 205 of a corresponding memory array (e.g., where p<n). In other examples, such a selection component or multiplexer may be omitted, and the side of a sense amplifier array 320 that is electrically coupled towards a data path 350 may be configured to support a same number of bits of data transfer as the side of the sense amplifier array 320 that is electrically coupled towards digit lines 215 or memory cells 205 of a corresponding memory array (e.g., where p=n).

The set of tile paths 310-*a* (e.g., the sense amplifier arrays 320-*a*), or various portions thereof, may be selectively coupled with the data path 350 using a tile multiplexer 340. In the example of memory layout 300, the tile multiplexer 340 is coupled with the respective tile bus 311-*a* for each of the tile paths 310-*a* (e.g., tile buses 311-*a*-1 through 311-*a*-*q*, a set of local I/O buses or lines), where each of the tile buses 311-*a* may be configured to carry p bits of information. Accordingly, where each of the p bits of information are carried on distinct signal paths, the tile multiplexer 340 may be configured for selective coupling or mapping of (p×q) signal paths on the array side of the tile multiplexer 340. On the data path side, the tile multiplexer 340 may be configured to carry r bits of information (e.g., corresponding to r digit lines 215-*a*, corresponding to r memory cells 205), and where each of the r bits of information are carried on distinct signal paths, the tile multiplexer 340 may be configured for selective coupling or mapping of r signal paths. In other words, the tile multiplexer 340 may be configured for selective coupling or mapping between (p×q) signal paths associated with tile buses 311-*a* and r signal paths associated with the data path 350 (e.g., a tile multiplexer bus 341). In some examples, the circuit path between the tile paths 310-*a* and the data path 350 (e.g., the circuit between sense amplifier arrays 320-*a* and a data sense amplifier component 360, including the tile buses 311-*a*, the tile multiplexer 340, and the tile multiplexer bus 341) may be referred to as a column path circuit.

In various examples, the tile multiplexer 340 may receive a signal (e.g., from a local memory controller 265) to couple the data path 350 with a particular tile path 310-*a*, or with portions of more than one tile path 310-*a*, according to a particular access operation. In one example, the tile multiplexer 340 may be configured to access memory tiles one-at-a-time, such that the data path 350 is coupled with r signal paths from a single memory tile (e.g., from r digit lines 215-*a* of a single tile bus 311-*a*). In another example, the tile multiplexer 340 may be configured to multiple access memory tiles at a time, such that the data path 350 is coupled a subset of r signals from a one memory tile (e.g., a first tile bus 311-*a*) and another subset of r signals from another memory tile (e.g., a second tile bus 311-*a*). For example, the tile multiplexer bus 341 may refer to a collection of main I/O lines, where one or more of the main I/O lines may be shared across a set of memory tiles or tile paths 310-*a* (e.g., a column of memory tiles, a row of memory tiles), and main I/O lines may be selectively coupled (e.g., by a portion of the tile multiplexer 340) with a local I/O line corresponding to one or more of the set of memory tiles or tile paths 310-*a*. In some examples, the tile multiplexer 340 may support accessing memory tiles one-at-a-time and many-at-a-time, and a selection between the two may be made at a local memory controller 265 for supporting a particular access operation, a particular mode of operation, or a particular configuration in a given application or installation.

Although the tile multiplexer 340 is illustrated as a single component, in some examples, various functions or subcomponents of the tile multiplexer 340 may be distributed in different portions of the memory layout 300 (e.g., as a distributed transistor network or selector network). For example, selective coupling, mapping, or routing at a first granularity or regularity may be accomplished by a first set of subcomponents, which may be part of the data path 350, and selective coupling, mapping, or routing at a second granularity or regularity may be accomplished by a second set of subcomponents, which may be distributed across the tile paths 310-*a*-1 through 310-*a*-*q*. Accordingly, the tile paths 310-*a* may include various circuitry that is dedicated to, or otherwise corresponds to operating respective memory tiles of a set of memory tiles, the data path 350 may include various circuitry that is dedicated to, or otherwise corresponds to operating all of the set of memory tiles, and various portions of the tile multiplexer 340 may or may not be considered to be part of the tile paths 310-*a*-1 through 310-*a*-*q* or the data path 350.

The data path 350 may illustrate an example of circuitry, corresponding to a plurality of memory tiles (e.g., all of the tile paths 310-*a*-1 through 310-*a*-*q*), that is configured to transfer information or provide various management of information associated with access operations for the plurality of memory tiles. In accordance with the described techniques for circuit partitioning, the components of the data path 350 may be located in the circuit layer or level of two or more memory tiles of the plurality of memory tiles. In the example of memory layout 300, the data path 350 includes a data sense amplifier component 360, a redundancy repair component 365, and an error correction component 370. In other examples of a memory layout, a data path 350 may include more or fewer components, or components that are divided into various other subcomponents or subfunctions. Moreover, although the data path 350 illustrates a single path between a tile multiplexer bus 341 and a data path bus 351, other examples of a data path 350 may have more than one path between a tile multiplexer bus 341 and a data path bus 351 (e.g., a read path and a write path). Thus, in some examples, the data path 350 may include circuitry configured to multiplex read or write pipelines of the memory layout 300.

The data sense amplifier component 360 may be referred to as a "front end" of the data path 350 and may include circuitry configured to amplify signals received at the data path 350 over the tile multiplexer bus 341. For example, to support various read operations, signals conveyed from one or more tile paths 310-*a* through the tile multiplexer 340 may have a first voltage swing (e.g., a partial swing or low swing, corresponding to reading the memory cells 205, corresponding to latch voltages of sense amplifiers 325-*a*, corresponding to a set of logic states that may be stored by the memory cells 205). To support various operations or processing of the data path 350, the data sense amplifier component 360 may amplify such signals to generate signals having a second voltage swing (e.g., a full swing or a high swing) that is greater than the first voltage swing. Using a relatively wider or greater voltage swing in the data path 350 may support more robust signal transfer through the data path 350, or to a local memory controller 265, which may be related to relatively lower sensitivity to interference, relatively lower sensitivity to voltage drop or signal decay along resistive signal paths, relatively lower sensitivity to various charge leakage paths in the data path 350, and other characteristics associated with a relatively greater voltage swing.

In some examples, the data sense amplifier component 360 may include a single amplifier for each signal path of the tile multiplexer bus 341 (e.g., a 1:1 correspondence between an amplifier and a memory cell 205 or bit of transferred information, a set of r amplifiers). Thus, the data sense amplifier component 360 may include one or more circuit elements for each memory cell 205, or each bit of information accessed in a memory array, involved in a given access operation. Such a granularity or regularity may be referred to as a "bit slice" of the data path 350, where each bit slice of the data path includes one or more circuit elements that are repeated for each bit or memory cell 205 involved in an access operation supported by the data path 350.

In some examples, the data sense amplifier component 360 may be used to support read operations but not write operations, and accordingly the data sense amplifier component 360 may be bypassed in some access operations (e.g., alternatively coupling the tile multiplexer bus 341 with a write driver of the data path 350, not shown). In some examples, a data sense amplifier component 360 may be omitted from a data path 350, such as when a sense amplifier array 320 or sense amplifiers 325 are configured to output a full swing or high swing output (e.g., to a data path 350), where full swing may refer to a same voltage swing as used in a portion of or at an output of the data path 350.

The redundancy repair component 365 may be configured to replace or reroute data that is read from or would otherwise be written to a digit line 215 or a memory cell 205 that is known to be faulty, or is suspected to be faulty (e.g., as identified from array detection operations, error correction operations, manufacturing validation operations). In a read operation, for example, the redundancy repair component 365 may be configured to ignore a bit received from the data sense amplifier component 360 or ignore a signal path from the data sense amplifier component 360 and reroute or otherwise reconfigure signals to account for the faulty digit line 215 or memory cell 205. In a write operation, for example, the redundancy repair component 365 may be configured to reroute or otherwise reconfigure write signals or data to avoid writing a bit to a faulty digit line 215 or memory cell 205. Accordingly, a bus on the array side of the redundancy repair component 365 may be configured to carry more bits than a bus on the opposite side of the redundancy repair component 365 (e.g., where s>t). In one example, the memory layout 300 may be configured for one redundancy bit per byte of information transfer on the data path bus 351 (e.g., one redundancy bit per eight bits of information), though such a ratio is configurable to other ratios based on various design tradeoffs.

The error correction component 370 may be configured to detect or correct various data corruption or errors, and, in some cases, may recover data (e.g., during a read operation) before transmitting over the data path bus 351. Such error detection and correction may rely upon one or more error-correcting codes such as block codes, convolutional codes, Hamming codes, low-density parity-check codes, turbo codes, polar codes, and others. These processes, operations, and techniques may be referred as ECC processes, ECC operations, ECC techniques, or, in some cases, as simply ECC. In some examples, the error correction component 370 may include or be referred to as an in-line ECC. In a read operation, for example, the error correction component 370 may perform an error correction operation on data read from a memory array (e.g., as read or otherwise conveyed from one or more tile paths 310-a) according to the read operation. The error correction component 370 may generate corrected data (e.g., in a correction subcomponent) or an indication of a detected error (e.g., in a detection subcomponent). The error correction component 370 may output data, which, in various circumstances, may be the data read from the memory array, or data that has been corrected.

In one example of performing ECC operations, the error correction component 370 may calculate the "syndrome" of incoming read data (e.g., as received from the redundancy repair component 365), and the syndrome may be compared to one or more corresponding parity bits that accompany the incoming read data (e.g., as read from a memory cell 205 of a same or different tile path 310-a). When the calculated syndrome does not equal the corresponding parity bit or bits, the error correction component 370 may attempt to correct the incoming read data before forwarding it (e.g., over the data path bus 351), or send a signal that an error has been detected (e.g., over the control bus 266-a), or both. In another example of performing ECC operations, the error correction component 370 may calculate the parity bit of incoming write data (e.g., as received from the local memory controller 265-a over the data path bus 351, for later comparison to a calculated syndrome when reading the data), and the calculated parity bit may be written to a memory cell 205 of a same or different tile path 310-a as where the incoming write data is written. In one example, the memory layout 300 may be configured for one parity or ECC bit per byte of information transfer on the data path bus 351 (e.g., one parity bit per eight bits of information), though such a ratio is configurable to other ratios based on various design tradeoffs.

In some examples, the error correction component 370 may include logic or circuitry to detect a memory cell 205 or a digit line 215 associated with charge leakage, store an indication of such a detection, and where appropriate, invert a logic state that is to be written to the memory cell 205 or digit line 215, or invert a logic state that is read from the memory cell 205 or digit line 215, to mitigate the effect of charge leakage.

The data path 350 (e.g., the data path bus 351) and the tile paths 310-a may be configured according to various multiples, multiplexing configurations, and selective operations. For example, the quantity of bits associated with access operations of the data path 350 (e.g., u bits of the data path bus 351) may correspond to a quantity of bits of an access command, such as a column access command, a column access strobe (CAS) command, or a prefetch command. Other buses of the memory layout 300 may be associated with a greater number of bits, according to various configurations of the memory layout 300.

In one illustrative example, the data path 350 may be associated with 256 bits of information transfer (e.g., a data packet or data burst of 256 bits), which, in some examples, may correspond to the data path bus 351 being configured with 256 separate conductive traces (e.g., where u=256). The error correction component 370 may be configured with one parity bit per eight bits of data transfer (e.g., on the data path bus 351), and accordingly the error correction component 370 may be coupled with the redundancy repair component 365 using a bus having 288 separate conductive traces (e.g., where t=288). The redundancy repair component 365 may be configured with one redundancy bit per eight bits of data transfer (e.g., on the data path bus 351), and accordingly the redundancy repair component 365 may be coupled with the data sense amplifier component 360 using a bus having 320 separate conductive traces (e.g., where s=320).

In examples of a data path 350 that includes a data sense amplifier component 360, the data sense amplifier component 360 may be configured with an amplifier for each of the conductive traces (e.g., on either side of the data sense amplifier component 360), and accordingly may be coupled with the tile multiplexer 340 and the redundancy repair component 365 using buses having a same number of conductive traces (e.g., where r=s=320). Thus, according to the illustrative example, the data path 350 may be configured to be communicatively coupled between a 320-bit or 320-conductor tile multiplexer bus 341 and a 256-bit or 256-trace data path bus 351. In other words, the data path 350 may be associated with a 25% overhead (e.g., a 125% ratio of memory cells 205 accessed in a given access operation to data bits conveyed with the local memory controller 265-a) to support redundancy and error correction operations for the set of memory tiles corresponding to the tile paths 310-a-1 through 310-a-q.

Continuing with the illustrative example, the tile paths 310-a and the tile multiplexer 340 may be configured with various multiples and multiplexing to support a 320-bit or 320-conductor tile multiplexer bus 341. For example, the memory layout 300 may include or correspond to a set or section of 64 memory tiles (e.g., where q=64). To support a given access operation, the tile multiplexer 340 may be configured to selectively couple half of the 64 corresponding tile paths 310-a (e.g., every other tile path 310-a according to an arrangement of tile paths 310-a in the set or section) with the tile multiplexer bus 341. Accordingly, the tile multiplexer bus 341 may be coupled with 32 tile paths 310-a using a respective 10-bit or 10-conductor tile bus 311-a (e.g., where p=10). In some examples, such a configuration may be supported by tile paths 310-a or tile buses 311-a that each include or are otherwise associated with two local I/O buses or lines, each configured to convey five bits (e.g., each having five individual conductors or traces, each coupled with a different subset of five sense amplifiers 325-a of a sense amplifier array 320).

Further continuing with the illustrative example, the sense amplifier arrays 320-a may be configured with various multiples and multiplexing to support 10-bit or 10-conductor tile buses 311-a. In one example, this configuration may correspond to a coupling with a sense amplifier array 320-a where each of the conductors of the respective tile bus 311-a is coupled with a single, dedicated sense amplifier 325-a (e.g., where n=p=10). In another example, this configuration may correspond to a sense amplifier array 320-a where conductors of the respective tile bus 311-a are selectively coupled with a subset of the sense amplifiers 325-a of the sense amplifier array 320-a (e.g., where n>p). For example, the sense amplifier arrays 320-a may each include 80 sense amplifiers 325 (e.g., where n=80), and the sense amplifier array 320-a may include a selection component or multiplexer that is configured to select or couple one of eight subsets of ten sense amplifiers 325-a with the respective tile bus 311-a.

Further continuing with the illustrative example, the memory cells 205 corresponding to a given tile path 310-a may be configured with various multiples and multiplexing to support the described coupling with a sense amplifier array 320-a. In one example, each of the tile paths 310-a may include or otherwise be associated with 2,560 digit lines 215-a (e.g., where m=2,560). According to different configurations of the memory layout 300, the digit line multiplexers 315-a may be configured to select or couple one of 256 subsets of ten digit lines 215-a with the respective sense amplifier array 320-a (e.g., to support a 10-bit or 10-conductor tile bus 311-a with a sense amplifier array 320-a having ten sense amplifiers 325-a), or the digit line multiplexers 315-a may be configured to select or couple one of 32 subsets of 80 digit lines 215-a with the respective sense amplifier array 320-a (e.g., to support a 10-bit or 10-conductor tile bus 311-a with a sense amplifier array 320-a having 80 sense amplifiers 325-a, arranged as eight selectable subsets of the sense amplifiers 325-a).

In one example of the memory layout 300, each of the tile paths 310-a may also include or otherwise be associated with 2,048 word lines 210. Thus, according to the illustrative example, the memory layout 300 may include memory tiles each having 5,242,880 memory cells 205. When the memory layout 300 refers to a section or bank of a memory device having 64 memory tiles, the memory layout 300 may therefore illustrate an arrangement that supports the selective accessing of an array of 335,544,320 memory cells 205 using a data path bus 351 associated with 256 bits of data transfer (e.g., 256 conductive traces).

In some examples, word lines 210 may be commonly accessed across multiple memory tiles (e.g., all or a subset of memory tiles within a bank or section), or signals for activating word lines 210 of different memory tiles may be shared or commonly driven. For example, in response to a particular prefetch or other access command, a page or row activation may correspond to an activation of 20,480 memory cells 205 or digit lines 215 (e.g., corresponding to 16,384 bits of data plus additional redundancy or parity bits), which may be distributed across 64 memory tiles, 32 memory tiles, 16 memory tiles, or some other number of memory tiles based on a particular multiplexing scheme of the memory layout 300 (e.g., according to different configurations of digit line multiplexers 315-a or tile multiplexer 340). In other examples (e.g., according to various partial activation, partial deactivation, or other idling techniques), a particular prefetch or other access command may be associated with half that quantity of memory cells 205 or digit lines 215, one quarter that quantity of memory cells 205 or digit lines 215, or some other amount. Signals from such a page or row activation may be selectively routed to various sense amplifier arrays 320-a of various tile paths 310-a in accordance with various examples of the described techniques.

In some examples, the data path 350 may be considered to end or terminate at die data pads of a memory die, such as a memory die 160 or a memory die 200. Although the memory layout 300 illustrates an example where a single data path 350 is coupled with the local memory controller 265-a, in other examples, a local memory controller 265, a local memory controller 165, or a device memory controller 155 may be selectively coupled with a set of more than one data path 350. In such examples, a memory die may include a data path multiplexer (not shown) configured to selectively couple the local memory controller 265, the local memory controller 165, or the device memory controller 155 with one or more of the corresponding data path buses to support various access operations.

Figure 4:
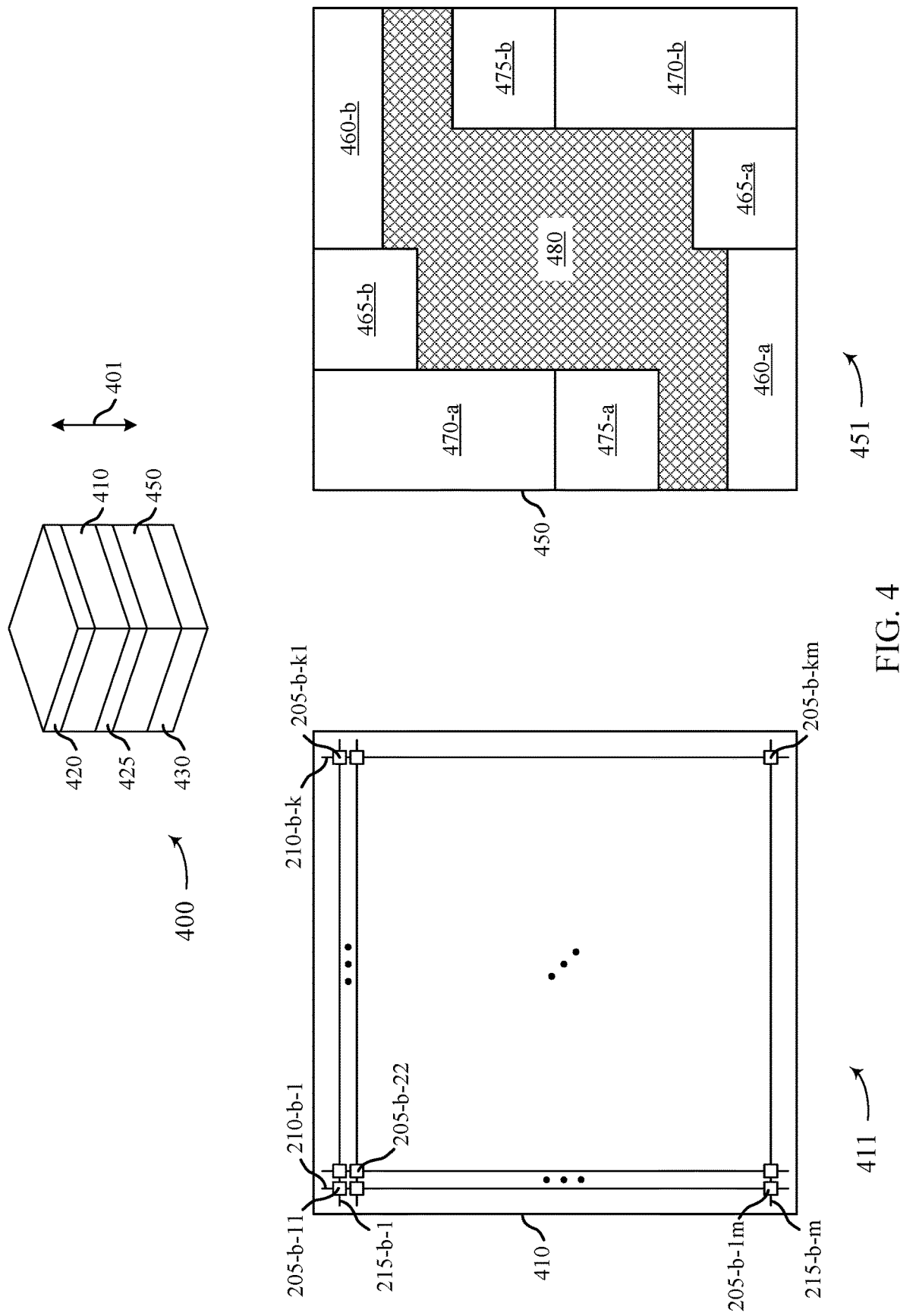
FIG. 4 illustrates an example layout of a memory tile that supports circuit partitioning for a memory device in accordance with examples as disclosed herein.

FIG. 4 illustrates an example layout of a memory tile 400 that supports circuit partitioning for a memory device in accordance with examples as disclosed herein. The memory tile 400 illustrates a layout having levels (e.g., layers) relative to a thickness direction 401, which may refer to a direction perpendicular to a substrate, or a direction otherwise perpendicular to a plane of memory cells 205. The memory tile 400 includes an example of an array level 410 and a circuit level 450, which are shown relative to a substrate level 430. Although the memory tile 400 is illustrated with an array level 410 being above a circuit level 450 (e.g., relative to the substrate 430), in other examples or memory tiles 400, an array level 410 may be below a circuit level 450. Further, although one array level 410 and one circuit level 450 is shown in the example of memory tile 400, other examples of a memory tile 400 may include more than one array level 410, or more than one circuit level 450, or more than one array level 410 and more than one circuit level 450.

The array level 410 includes a plurality of memory cells 205-b, associated with word lines 210-b and digit lines 215-b that are configured to access the memory cells 205-b of the array level 410 (e.g., of the memory tile 400). For example, the array level 410 may include or be associated with k word lines 210-b (e.g., word lines 210-b-1 through 210-b-k) and m digit lines 215-b (e.g., digit lines 215-b-1 through 215-b-m), that are associated with the memory cells 205-b-11 through 205-b-km (e.g., a quantity of (k×m) memory cells 205). In an illustrative example, the array level 410 may be associated with 2,048 word lines 210-b (e.g., where k=2,048) and 2,560 digit lines 215-b (e.g., where m=2,560), and accordingly may be associated with 5,242,880 memory cells 205-b. However, the described techniques may support memory tiles 400 having other quantities of memory cells 205, word lines 210, and digit lines 215.

The array level 410 is illustrated with a top view 411, showing word lines 210-b and digit lines 215-b intersecting at respective memory cells 205-b. However, the memory cells 205-b, word lines 210-b, and digit lines 215-b may be formed or located at different positions or sub-levels (e.g., in the thickness direction 401) of the memory tile 400. In one example, the word lines 210-b may be below the memory cells 205-b (e.g., nearer to the substrate 430), and the digit lines 215-b may be below the word lines 210-b. Further, the array level may also include a plurality of plate lines 220 (not shown), or a common plate conductor, which may be formed or located at another position or sub-level of the memory tile 400 or array level 410. For example, the memory tile 400 or array level 410 may include a common plate conductor that is above the memory cells 205-b (e.g., farther from the substrate 430), and is shared by all the memory cells 205-b of the array level 410 (e.g., of the memory tile 400), which may refer to a common electrical node to all of the memory cells 205-b (e.g., a common electrical node of the memory tile 400). In one example, an array of memory cells 205 that all share such a common electrical node or common plate may define the extents (e.g., in number of word lines 210, in number of digit lines 215, in dimensions perpendicular to the thickness direction 401) of the memory tile 400. However, in some examples, the memory tile 400 may be subdivided into sub-units that have separately controllable plate nodes, or multiple memory tiles 400 may share a single controllable plate node, or such common electrical nodes or common plates of multiple memory tiles 400 that are separately controllable may be otherwise controlled to a same biasing (e.g., commonly controlled).

The array level 410 may be defined in the thickness direction 401 according to various constituent components. In the described example having a common plate conductor above the memory cells 205-b and the digit lines 215-b below the word lines 210-b, the array level 410 may be defined by an illustrative range in the thickness direction 401 that includes the common plate conductor and the digit lines 215-b, and portions of the array level 410 therebetween (e.g., the word lines 210-b and the memory cells 205-b). In another example, the array level 410 may be defined by an illustrative range in the thickness direction 401 by the memory cells 205-b (e.g., including the various features that are specific to a respective memory cell 205-b, including a storage element such as a capacitor 240 or configurable material memory element, a switching component 245, where present, and other memory cell features), in which case access lines or nodes such as the word lines 210-b, the digit lines 215-b, and plate lines 220 or a common plate conductor are considered to be outside (e.g., above or below) the array level 410. In some examples, the range in the thickness direction 401 that includes the features of the memory cells 205-b may be considered to be a minimum range in the thickness direction 401 that defines an array level 410.

The circuit level 450 may include various circuitry configured to operate the memory cells 205-b of the array level 410 (e.g., tile-specific circuitry, circuitry primarily corresponding to the memory tile 400, circuitry corresponding to or primarily assigned to the memory cells 205-b-11 through 205-b-km). For example, the circuit level 450 may include various decoders, buffers, multiplexers, sense amplifiers, or other components that may be dedicated to the operation of memory cells 205-b-11 through 205-b-km, and, in various examples, such circuitry may not be used in the operation of other memory cells 205 (e.g., of another memory tile 400, not shown) in the same or an adjacent section, or may be used in the operation of memory cells 205 of an adjacent memory tile 400 according to particular modes of operation. The circuit level 450 is illustrated with a top view 451, illustrating an example of a memory tile 400 that includes word line decoder portions 460, word line driver portions 465, digit line decoder portions 470, and digit line driver portions 475, but memory tiles 400 may include a circuit level 450 having a different arrangement components, or more or fewer components, that are primarily assigned to the operation of the memory tile 400.

The word line decoder portions 460 and the word line driver portions 465 may correspond to the word lines 210-b-1 through 210-b-k of the memory tile 400, and may be included in or otherwise refer to operations of a row decoder 225 described with reference to FIG. 2. The memory tile 400 illustrates an example where the circuit level 450 includes word line decoder portions 460 and word line driver portions 465 corresponding to different subsets of the word lines 210-b-1 through 210-b-k. For example, the word line decoder portion 460-a and the word line driver portion 465-a may correspond to word lines 210-b-1 through 210-b-(k/2), and the word line decoder portion 460-b and the word line driver portion 465-b may correspond to word lines 210-b-(k/2+1) through 210-b-k. As illustrated, in some examples, the word line decoder portion 460-a and the word line driver portion 465-a may be on an opposite end of the memory tile 400 (e.g., along a direction of word lines 210-b) from the word line decoder portion 460-b and the word line driver portion 465-b.

The word line decoder portions 460 and the word line driver portions 465 may perform various operations associated with selective accessing or activation of the word lines 210-b. For example, the word line driver portions 465 may be configured to receive control signals (e.g., via a control bus 266) associated with access commands (e.g., read commands, write commands) corresponding to the memory cells 205-b of the array level 410. In some examples, such access commands may be associated with a command to open a page of memory cells that includes a row of memory cells 205-b in the array level 410. The word line driver portions 465 may also include components or circuitry for buffering associated with access commands (e.g., a control buffer). In some examples, the word line driver portions 465 may include a voltage source for selectively activating word lines 210-b, or may be in electronic communication with such a voltage source that is shared between multiple memory tiles 400. The word line decoder portions 460 may include various multiplexing components (e.g., a transistor network) configured to couple a selection voltage source with a selected one or more of the word lines 210-b.

The digit line decoder portions 470 and the digit line driver portions 475 may correspond to the digit lines 215-b-1 through 215-b-m of the memory tile 400, and may be included in or otherwise refer to operations of a column decoder 230, a sense component 250, or an input/output component 260, or a combination thereof, described with reference to FIG. 2. In some examples, the digit line decoder portions 470 and the digit line driver portions 475 of the memory tile 400 may collectively refer to or be associated with at least a portion of a tile path 310. The memory tile 400 illustrates an example where the circuit level 450 includes digit line decoder portions 470 and digit line driver portions 475 corresponding to different subsets of the digit lines 215-b-1 through 215-b-m. For example, the digit line decoder portion 470-a and the digit line driver portion 475-a may correspond to digit lines 215-b-1 through 215-b-(m/2), and the digit line decoder portion 470-b and the digit line driver portion 475-b may correspond to digit lines 215-b-(m/2+1) through 215-b-m. As illustrated, in some examples, the digit line decoder portion 470-a and the digit line driver portion 475-a may be on an opposite end of the memory tile 400 (e.g., along a direction of digit lines 215-b) from the digit line decoder portion 470-b and the digit line driver portion 475-b.

The digit line decoder portions 470 and the digit line driver portions 475 may perform various operations associated with selective accessing or activation of the digit lines 215-b. For example, the digit line driver portions 475 may be configured to receive control signals (e.g., via a control bus 266) associated with access commands (e.g., read commands, write commands) corresponding to the memory cells 205-b of the array level 410. Additionally or alternatively, the digit line driver portions 475 may be configured to communicate data signals (e.g., with a tile multiplexer 340, with a data path 350, via a tile bus 311, via an input/output component 260) associated with access commands corresponding to the memory cells 205-b of the memory tile 400, and accordingly may include a transmitter, receiver, or transceiver associated with a tile bus 311. In other words, the memory tile 400 may be associated with a tile bus 311 that is connected with the digit line driver portions 475-a and 475-b (e.g., each coupled with a respective portion of the tile bus 311). In another example for defining extents of a memory tile 400 (e.g., in number of word lines 210, in number of digit lines 215, in dimensions perpendicular to the thickness direction 401), an array of memory cells 205 that all share a common tile bus 311 may define such extents. The digit line driver portions 475 may also include components or circuitry for buffering associated with access commands (e.g., a control buffer, a data buffer).

In some examples, access commands may be associated with a command to access or activate a subset of the digit lines 215-b of the memory tile 400, and each of the digit line decoder portions 470 may include a respective digit line multiplexer 315, or portion thereof, that receives control signaling via a control bus 266 to perform selective activations or connections. In another example, each of the digit line driver portions 475 may include a respective sense amplifier array 320, or portion thereof, including a plurality of sense amplifiers 325 (e.g., a respective subset or subarray of sense amplifiers 325) that may be selectively coupled with ones of the digit lines 215-b (e.g., by a digit line multiplexer 315 of the respective digit line driver portion 475) for detecting a logic state of a particular memory cell 205-b.

In some examples, the digit line driver portions 475 may include voltage sources for selectively activating or charging digit lines 215-b, or be in electronic communication with such a voltage source that is shared between multiple memory tiles. In some examples, the digit line driver portions 475 may include signal development components (e.g., of a sense amplifier array 320, or between a sense amplifier array 320 and memory cells 205-b) that develop, convert, or amplify signals to support the detection of logic states from the memory cells 205-b, or the writing of logic states to the memory cells 205-b.

In various examples, the circuit level 450 may be defined in the thickness direction 401 according to different constituent components. In one example, the circuit level 450 may be defined in the thickness direction 401 by the farthest extents in the thickness direction 401 of the circuitry corresponding to the operation of the memory tile 400 (e.g., the farthest extents of the union, in the thickness direction 401, of tile-specific circuitry of the memory tile 400, the farthest extents of the word line decoder portions 460, word line driver portions 465, digit line decoder portions 470, and digit line driver portions 475, collectively). In another example, the circuit level 450 may be defined in the thickness direction 401 by the extents in the thickness direction 401 having a portion of each type of circuitry corresponding to the operation of the memory tile 400 (e.g., the farthest extents of the intersection, in the thickness direction 401, of tile-specific circuitry of the memory tile 400, the farthest extents of the word line decoder portions 460, word line driver portions 465, digit line decoder portions 470, and digit line driver portions 475, collectively).

The memory tile 400 may also include, or be otherwise associated with routing levels, which may be considered to routing levels of the memory tile 400, routing levels of a bank or section of multiple (e.g., adjacent) memory tiles 400, routing levels of a plurality of banks or sections of memory tiles 400, or, more generally, routing levels of a memory die 160 or a memory die 200. For example, the memory tile 400 may include a routing level 420, which may be referred to as an "over-array" routing level, and a routing level 425, which may be referred to as an "under-array" routing level.

The routing levels 420 and 425 may include one or more levels or layers (e.g., stacked in the thickness direction 401) of conductive paths for routing signals or power (e.g., supplied voltage, supplied current) in a memory die. In one example, the routing level 420 may include four layers of conductive paths, where two of the layers each include a plurality of conductive paths that are perpendicular to word lines 210 (e.g., of the array level 410) and two of the layers each include a plurality of signal paths that are perpendicular to digit lines 215. In another example, the routing level 425 may include three layers of conductive paths, where two of the layers each include a plurality of conductive paths that are perpendicular to word lines 210 and one of the layers includes a plurality of conductive paths that are perpendicular to digit lines 215. However, various arrangements of conductive paths may be used in a routing level 420 or 425, including layers having conductive paths in multiple directions or conductive paths that are nonlinear. In some examples, one or more of the conductive paths of the routing level 420 (e.g., sublayers of the routing level 420) may be formed of copper, and one of more of the conductive paths of the routing level 425 (e.g., sublayers of the routing level 425) may be formed of tungsten, where such formation may include selective deposition or removal (e.g., etching) to form the particular signal paths.

In some examples, the array level 410 or the circuit level 450 may be defined in the thickness direction 401 according to the relative positions of routing layers. In one example, the array level 410 may correspond to the portion of the memory tile 400 that is between a routing level 420 and a routing level 425 (e.g., along the thickness direction 401). In another example, the circuit level 450 may correspond to the portion of the memory tile 400 that is between a routing level 425 and a substrate 430 or another routing level (not shown).

The memory tile 400 may also include conductors along the thickness direction 401, which may be referred to as "sockets" (not shown). Sockets may provide conductive paths between levels or layers of the memory tile 400, such as between adjacent levels (e.g., between a routing level 420 and an array level 410) or between non-adjacent levels (e.g., between an array level 410 and a circuit level 450). In various examples, sockets may be located within the illustrative boundary of the memory tile 400 (e.g., in a top view), or outside the illustrative boundary of the memory tile 400 (e.g., between memory tiles), or both.

As illustrated by the top view 451 of the circuit level 450, not all of the area of the circuit level 450 of the memory tile 400 is occupied by the circuitry primarily associated with the memory tile 400 (e.g., the word line decoder portions 460, word line driver portions 465, digit line decoder portions 470, and digit line driver portions 475, collectively). Rather, the circuit level 450 also includes an area 480 that is available for other purposes. In some examples, a plurality of memory tiles 400 (e.g., a section of memory tiles 400, a quilt of memory tiles 400) may be associated with a data path 350, and circuitry associated with the data path 350 may be distributed across the respective areas 480 of the plurality of memory tiles 400.

Figure 5:
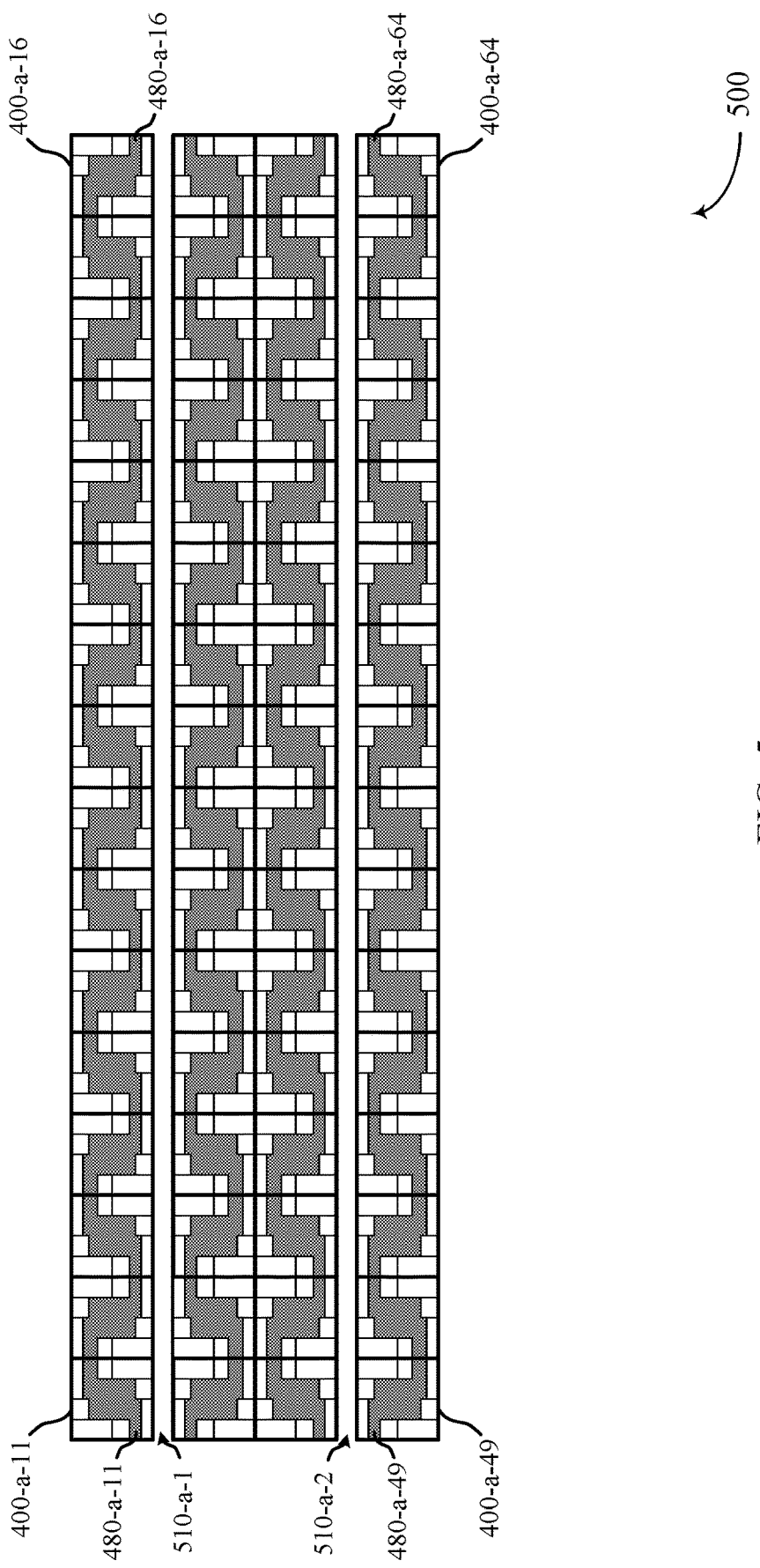
FIG. 5 illustrates an example of a memory section that supports circuit partitioning for a memory device in accordance with examples as disclosed herein.

FIG. 5 illustrates an example of a memory array 500 that supports circuit partitioning for a memory device in accordance with examples as disclosed herein. In various examples, the memory array 500 may represent a subset of a larger memory array (e.g., of a memory array 170 of a memory die 160), or may be one of multiple memory arrays of a memory device (e.g., of a memory device 110, of a memory die 170), but may be representative for illustrating the teachings herein. The memory array 500 includes a set of 64 memory tiles 400-*a* (e.g., memory tiles 400-*a*-1 through 400-*a*-64), which may be referred to as a quilt of memory tiles 400, and thus the memory array 500 may be referred to as a quilt array or as having a quilt architecture. In some cases, a row of a memory tiles 400-*a* within the memory array 500 may be referred as a section or bank of the memory array 500. One or more memory tiles 400-*a* within a section may be activated based on a same activation command, and accessed based on a same access command.

Although only the circuit level 450 of each of the memory tiles 400-*a* is shown, each of the memory tiles 400-*a* is also associated with a respective array level 410 including a set of memory cells 205. Each of the memory tiles 400-*a* may also be associated with routing layers (e.g., routing levels 420, routing levels 425), which in various examples may be associated with respective ones of the memory tiles 400-*a*, or may be associated with multiples of the memory tiles 400-*a* (e.g., routing layers common to the memory array 500). Following aspects of the example of memory tile 400 described with reference to FIG. 4, where a memory tile 400 includes 5,242,880 memory cells 205, the memory array 500, having 64 memory tiles 400-*a*, may be associated with 335,544,320 memory cells 205.

The memory array 500 may also include various configurations of gaps between tiles, such as gap regions 510-*a*-1 and 510-*a*-2 between rows of the memory tiles 400-*a*. In some examples, gap regions 510-*a* may provide an area (e.g., as viewed in a top view) for sockets or socket connectors various levels of the memory array 500 (e.g., along a thickness direction 401). Although the memory array 500 is shown with gap regions 510-*a* between rows of memory tiles 400-*a* of the memory array 500, in other examples, a memory array 500 may additionally or alternatively be configured with various gap regions 510 between memory tiles 400 of a row, between columns of memory tiles 400, between memory tiles 400 of a row, and so on.

The memory array 500 may be associated with a data path 350 (not shown) that corresponds to operations of all of the memory cells 205 associated with the 64 memory tiles 400-*a*-1 through 400-*a*-64. For example, the memory array 500 may be associated with a single data path bus 351 that communicates information associated with access operations on the memory tiles 400-*a* with a local memory controller 265. In other words, the data path 350 that corresponds to the memory tiles 400-*a*-1 through 400-*a*-64 may be shared by the memory tiles 400-*a*-1 through 400-*a*-64, and the data path 350 may be in selective communication with each of the memory tiles 400-*a*-1 through 400-*a*-64 over a respective tile bus 311 (e.g., via a tile multiplexer 340).

The memory array 500 also includes a set of 64 areas 480-*a* (e.g., areas 480-*a*-1 through 480-*a*-64) that are not occupied by circuitry that is primarily dedicated to respective memory tiles 400-*a* (e.g., not occupied by word line decoder portions 460, word line driver portions 465, digit line decoder portions 470, and digit line driver portions 475). Thus, the collective set of areas 480-*a* may be available for distributing various components or circuitry of the associated data path 350. The components or circuitry of the associated data path 350 may be distributed across the set of areas 480 according to various functional granularities or regularities, such as a 1:1 granularity (e.g., a particular conductor or component dedicated to a single bit of information), an 8:1 granularity (e.g., a particular bus or component dedicated to a set of eight bits or one byte of information), or a granularity that corresponds to a quantity of bits of information of the associated data path bus 351 (e.g., a section-level or bank-level granularity). Although the collective set of areas 480-*a* is available for distributing various components or circuitry of the associated data path 350, the data path 350 may be distributed across the entirety of the collective set of areas 480-*a* or various subsets of the collective set of areas 480-*a* (e.g., some or all of the areas 480-*a*, some or all of a respective area 480-*a*, or combinations thereof). Thus, in at least some cases, the data path 350 may be configured to carry or otherwise process data associated with more memory tiles 400 that those corresponding to the areas 480-*a* across which the data path 350 is distributed.

The example of memory array 500 illustrates an example of reflecting patterns or layouts of memory tiles 400 across the memory section. For example, one or both of the memory tile 400-*a*-16 or the memory tile 400-*a*-49 may have a same layout (e.g., of a circuit level 450) as the memory tile 400 described with reference to FIG. 4. In one example, the memory tile 400-*a*-11 or the memory tile 400-*a*-64 may have a layout that is reflected across a vertical plane of symmetry (e.g., parallel to word lines 210) as compared with the memory tile 400 described with reference to FIG. 4. Alternatively or equivalently, in another interpretation the memory tile 400-*a*-11 or the memory tile 400-*a*-64 may have a layout that is reflected across a horizontal plane of symmetry (e.g., parallel to digit lines 215) as compared with the memory tile 400 described with reference to FIG. 4. Similar or other formulations of reflections may be carried across other memory tiles of the memory array 500 according to different signaling or other functional layouts.

When implementing layout reflections such as those illustrated by the memory array 500, areas 480-*a* of adjacent memory tiles 400-*a* may be coincident or otherwise matched or aligned (e.g., across an illustrative boundary between one memory tile 400-*a* and another memory tile 400-*a*), which may support interconnection of signals or components (e.g., of a tile multiplexer 340 or portion thereof, of a data path 350 or a portion thereof) between circuit levels 450 of adjacent memory tiles 400. In the example of memory array 500, the areas 480-*a* of a row of memory tiles 400-*a*, for example, may combine to form winding or "snake-like" areas that may be used for various portions of circuitry associated with a data path 350.

Figure 6:
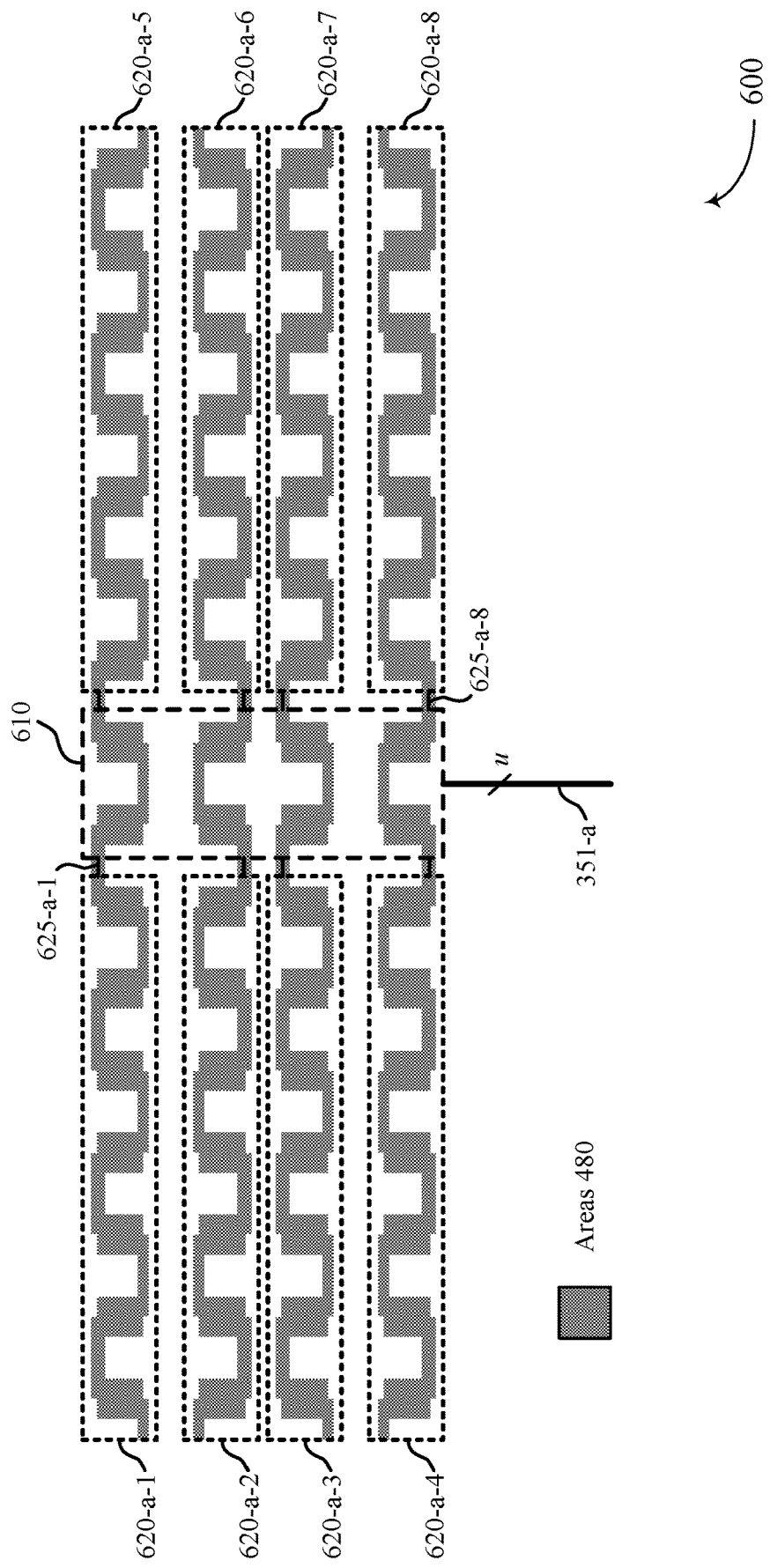
FIG. 6 illustrates an example of a memory section layout that supports circuit partitioning for a memory device in accordance with examples as disclosed herein.

FIG. 6 illustrates an example of a memory array layout 600 that supports circuit partitioning for a memory device in accordance with examples as disclosed herein. The memory array layout 600 may illustrate an example of how circuitry of a data path 350 can be distributed across the circuit levels 450 (e.g., in areas 480) of 64 memory tiles 400, such as those corresponding to the memory array 500 described with reference to FIG. 5. For illustrative clarity, certain boundaries and reference numerals have been omitted as compared with the memory array 500, but the memory array layout 600 may be considered as an alternative view of such a memory section (e.g., of a collection of circuit levels 450 of associated memory tiles 400). The memory array layout 600 may be associated with a data path bus 351-*a*, which may be an example of a data path bus 351 described with reference to FIG. 3, corresponding to a data path 350 of the memory array layout 600 (not shown).

In the example of memory array layout 600, a data path 350 may be divided amongst the areas 480 of a central subblock 610 and a set of wing subblocks 620, such as those indicated by the illustrative boundaries of the memory array layout 600. For each of the central subblock 610 and the wing subblocks 620, the components or circuitry of the respective portions of a data path 350 may be located in the areas 480 within the illustrative boundaries. For example, the central subblock 610 may include or otherwise refer to the areas 480 corresponding to eight memory tiles 400 (e.g., arranged in four rows by two columns), and each of the wing subblocks 620-*a* may include or otherwise refer to the areas 480 corresponding to seven memory tiles 400 (e.g., each arranged in a single row). However, other quantities or arrangements of memory tiles 400 and wing subblocks 620 may be used to support the techniques described herein. Each of the wing subblocks 620-*a* may be coupled with (e.g., in electronic communication with) the central subblock 610 using a respective intermediate bus 625-*a*, which, in some examples, may be located in a region where areas 480 of adjacent memory tiles 400 are coincident or otherwise aligned at an illustrative boundary between the adjacent memory tiles 400.

The memory tiles 400 of the memory array layout 600 may be coupled with or otherwise in communication with circuitry of the wing subblocks 620-*a* according to various multiplexing and signal routing configurations. In some examples, data path circuitry associated with a particular wing subblock 620-*a* may be configured to be selectively coupled with at least the memory cells 205 of the array levels 410 of the memory tiles 400 corresponding to the wing subblock 620-*a*. For example, the wing subblock 620-*a*-1 may be configured to be selectively coupled with memory cells 205 (e.g., the array level 410) of each of the seven memory tiles 400 that are within or otherwise overlap with the illustrative boundary of the wing subblock 620-*a*-1.

Additionally or alternatively, data path circuitry associated with a particular wing subblock 620-*a* may be configured to be selectively coupled with memory cells 205 (e.g., array levels 410) that are not within or do not overlap the illustrative boundary of the wing subblock 620-*a*. For example, the wing subblock 620-*a*-1 may be configured to be selectively coupled with memory cells 205 (e.g., the array level 410) of a memory tiles 400 that is within or overlaps the illustrative boundary of the central subblock 610 (e.g., the memory tile 400 adjacent to the wing subblock 620-*a*-1, a memory tile 400 connected to the wing subblock 620-*a*-1 using the intermediate bus 625-*a*-1). In another example, the wing subblock 620-*a*-1 may be configured to be selectively coupled with memory cells 205 (e.g., the array level 410) of one or more memory tiles 400 that are within or otherwise overlap the illustrative boundary of the wing subblock 620-*a*-2, or are within or otherwise overlap the illustrative boundary of the wing subblock 620-*a*-5.

In some examples, memory cells 205 or array levels 410 of a memory tile 400 may be configured to be selectively coupled with more than one wing subblock 620-*a*. For example, the wing subblocks 620-*a*-1, 620-*a*-2, 620-*a*-3, and 620-*a*-4 may be configured to be selectively coupled with any of the memory cells 205 of the left half of the memory tiles 400 (e.g., the first 8 memory tiles 400 from the left of each of the rows of memory tiles 400). In another example, the wing subblocks 620-*a*-1 and 620-*a*-5 may be configured to be selectively coupled with any of the memory cells 205 of the top row memory tiles 400. In another example, each of the wing subblocks 620-*a*-1 through 620-*a*-8 may be configured to be selectively coupled with any of the memory tiles 400-*a*-1 through 400-*a*-64.

The intermediate buses 625-*a* may be configured to communicate various quantities of information with the central subblock 610. For example, the data path bus 351-*a* may be configured to carry u bits of information (e.g., over u conductive signal paths). In some examples, the same quantity of bits may be divided across the intermediate buses 625-*a*, such that each of the intermediate buses 625-*a* is configured to carry u/8 bits of information (e.g., over u/8 conductive signal paths). In such examples, the central subblock 610 may not include circuitry related to error correction or redundancy, but may include various circuitry for multiplexing data or control signaling as required to support communications over the data path bus 351-*a* or the intermediate buses 625-*a*.

In other examples, the intermediate buses 625-*a* may collectively be configured to carry a different quantity of bits than the data path bus 351-*a*. For example, when the central subblock 610 includes components or circuitry related to error correction (e.g., of an error correction component 370) of a data path 350, the central subblock 610 may be configured to collectively convey a quantity of t bits (e.g., as described with reference to the memory layout 300 of FIG. 3) over the intermediate buses 625-a-1 through 625-a-8 with the wing subblocks 620-a-1 through 620-a-8. In such examples, each of the intermediate buses 625-a may configured to carry t/8 bits of information (e.g., over t/8 conductive signal paths), which may be more than the quantity u/8, and thereby support the communication of additional information such as parity bits. With further reference to such an example, a redundancy repair component 365 may be divided into eight subcomponents each located in a respective wing subblock 620-a, and a data sense amplifier component 360 may also be divided into eight subcomponents each located in a respective wing subblock 620-a.

The wing subblocks 620-a may collectively include circuitry configured to support the u bits of information of the data path bus 351-a, which may collectively correspond to the quantity r of a tile multiplexer bus 341 described with reference to FIG. 3. Accordingly, each of the wing subblocks 620-a may be configured to convey information associated with one eighth of such a tile multiplexer bus 341, such as r/8 bits, or signaling otherwise associated with accessing r/8 memory cells 205, which may or may not correspond to the quantity p described with reference to FIG. 3, depending on a particular multiplexing or signal routing scheme applied to support the memory array layout 600.

Thus, the memory array layout 600 illustrates an example of how a data path 350 may be divided into circuitry having different granularities or regularities (e.g., with respect to a quantity of bits of information, with a quantity of bits or conductors u of a data path bus 351). For example, the memory array layout 600 may illustrate an example of a layout (e.g., across areas 480) for a data path 350 having a first subset of circuitry associated with all of the quantity of bits of data transfer (e.g., in the central subblock 610) and a second subset of circuitry comprising a plurality of circuit portions (e.g., redundancy repair subcomponents, data sense amplifier subcomponents), where each circuit portion of the plurality is associated with a respective subset of the quantity of bits (e.g., u/8, t/8), and each circuit portion of the plurality is distributed across the circuit layer of a respective subset of the plurality of memory tiles (e.g., each in a respective one of the wing subblocks 620-a).

Although the memory array layout 600 may illustrate a distribution of a data path 350 among circuit levels 450 (e.g., areas 480) of 64 memory tiles 400, the data path 350 corresponding to the memory array layout 600 may be associated with a memory array having different characteristics than those described with reference to the memory array 500 of FIG. 5. For example, data path 350 distributed according to the memory array layout 600 may be associated with memory cells 205 of more than the 64 memory tiles 400, such as an association with memory cells 205 of 112 memory tiles 400 (e.g., of array levels 410 of 112 memory tiles 400), where additional memory tiles 400 (not shown) may be arranged as additional rows of memory tiles 400, additional columns of memory tiles 400, or both, compared to the illustration of the memory array layout 600 or memory array 500. In such an example (e.g., where a memory tile 400 includes 5,242,880 memory cells 205), a data path 350 distributed according to the memory array layout 600, when corresponding to memory cells 205 of 112 memory tiles 400, may be associated with 587,202,560 memory cells 205. Such an example may be illustrative of a memory array having a plurality of memory tiles 400, and a corresponding data path 350 distributed across or among a subset of the plurality of memory tiles 400 (e.g., a subset of the circuit levels 450).

Figure 7:
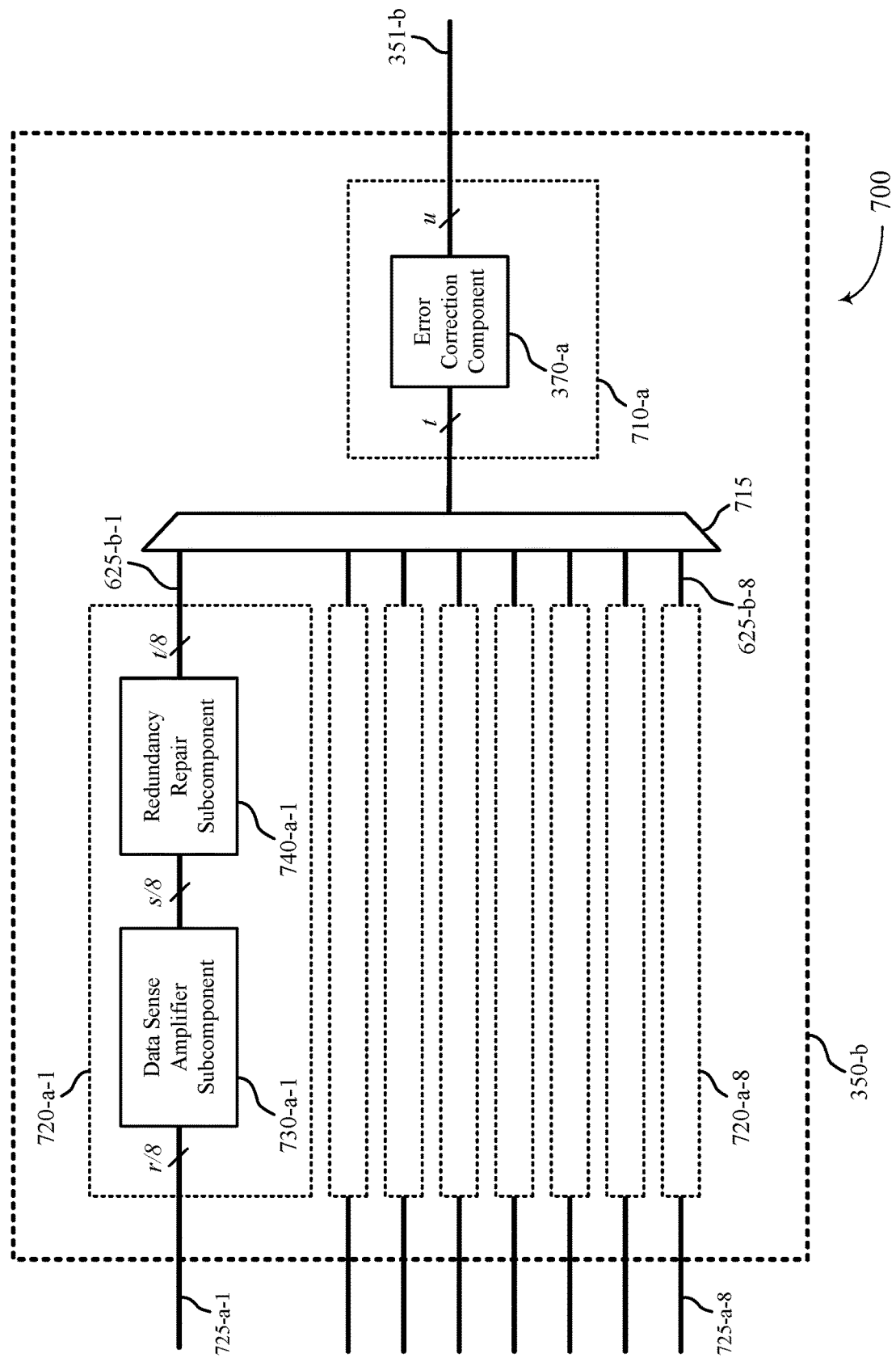
FIGS. 7 through 9 illustrate examples of data path layouts that support circuit partitioning for a memory device in accordance with examples as disclosed herein.

FIG. 7 illustrates an example of a data path layout 700 that supports circuit partitioning for a memory device in accordance with examples as disclosed herein. The data path layout 700 illustrates an example of a data path 350-b associated with a data path bus 351-b configured for u bits of information (e.g., as described with reference to FIG. 3). The data path layout 700 illustrates an example of distributing (e.g., dividing, arranging, partitioning) circuitry of the data path 350-b among central subblock circuitry 710 (e.g., central subblock circuitry 710-a) and wing subblock circuitry 720 (e.g., wing subblock circuitry 720-a-1 through 720-a-8).

The central subblock circuitry 710-a illustrates an example of circuitry that may correspond to (e.g., be included within the illustrative boundary of) a central subblock of a memory array 500, such as a central subblock 610 described with reference to FIG. 6. In the example of data path layout 700, the central subblock circuitry 710-a includes an error correction component 370-a, which may be an example of the error correction component 370 described with reference to FIG. 3. The error correction component 370-a may be configured to communicate, in aggregate, t bits of information with the wing subblock circuitry 720-a-1 through 720-a-8, which may be conveyed using an intermediate multiplexer 715. The intermediate multiplexer 715 may be configured for selective communication over various signal paths, or may be illustrative of fixed signal paths that connect the central subblock circuitry 710-a with the wing subblock circuitry 720-a-1 through 720-a-8 (e.g., a functional or illustrative combining of eight buses conveying t/8 bits of information into a single bus conveying t bits of information). In some examples, one or more subcomponents or signal paths of the intermediate multiplexer 715 may be located within or be otherwise associated with central subblock circuitry 710-a or wing subblock circuitry 720-a-1 through 720-a-8.

The wing subblock circuitry 720-a illustrates an example of circuitry that may correspond to (e.g., be included within the illustrative boundary of) a wing subblock of a memory section, such as a wing subblock 620 described with reference to FIG. 6. Each of the wing subblock circuitry 720-a may be in communication with the central subblock circuitry 710-a via a respective intermediate bus 625-b, which may be an example of the intermediate buses 625-a described with reference to FIG. 6. Each of the wing subblock circuitry 720-a-1 through 720-a-8 may be in communication with memory cells 205 of a respective plurality of memory tiles 400 (e.g., via a respective wing subblock bus 725-a), and the respective pluralities of memory tiles 400 associated with the wing subblock circuitry 720-a may or may not be mutually exclusive, depending on the signal path routing or multiplexing techniques applied in a given memory section.

The wing subblock circuitry 720-a may collectively include circuitry configured to support the u bits of information of the data path bus 351-b, which may correspond to the quantity r of a tile multiplexer bus 341 described with reference to FIG. 3. Accordingly, each instance of the wing subblock circuitry 720-a may be configured to convey information associated with one eighth of such a multiplexer bus 341, such as r/8 bits, or signaling otherwise associated with accessing r/8 memory cells 205, which may or may not correspond to the quantity p described with reference to FIG. 3, depending on a particular multiplexing or signal routing scheme applied to support the memory array layout 600.

In the example of data path layout 700, each of the wing subblock circuitry 720-*a*-1 through 720-*a*-8 includes a data sense amplifier subcomponent 730-*a* and a redundancy repair subcomponent 740-*a*, where such components that are illustrated in the wing subblock circuitry 720-*a*-1 may be repeated in each of wing subblock circuitry 720-*a*-2 through 720-*a*-8. The data sense amplifier subcomponents 730-*a*-1 through 730-*a*-8 may collectively be considered an example of, or otherwise perform the functions of a data sense amplifier component 360 described with reference to FIG. 3. Similarly, the redundancy repair subcomponents 740-*a*-1 through 740-*a*-8 may collectively be considered an example of, or otherwise perform the functions of a redundancy repair component 365 described with reference to FIG. 3. In some examples, the wing subblock circuitry 720-*a*-1 through 720-*a*-8 may include write driver circuitry, such as those described with reference to FIG. 3 (e.g., as respective write driver subcomponents in each of the wing subblock circuitry 720-*a*-1 through 720-*a*-8).

The example of data path layout 700 illustrates a granularity or regularity where information associated with the data path bus 351-*b* (e.g., as communicated via the central subblock circuitry 710-*a*) is divided across eight substantially repeated subcomponents (e.g., wing subblock circuitry 720-*a*-1 through 720-*a*-1). Accordingly, the wing subblock circuitry 720-*a* illustrates an example of a data path having a first subset of circuitry associated with all of the quantity of bits of data transfer (e.g., the central subblock circuitry 710-*a*) and a second subset of circuitry comprising a plurality of circuit portions (e.g., respective ones of the wing subblock circuitry 720-*a*), where each circuit portion of the plurality is associated with a respective subset of the quantity of bits (e.g., u/8, t/8).

Although the data sense amplifier subcomponents 730-*a* are illustrated and described as being a single component of a respective wing subblock circuitry 720-*a*, in other examples, a data sense amplifier subcomponent 730 may be further subdivided. For example, a data sense amplifier subcomponent 730 may be illustrative of a set of individual data sense amplifiers, each corresponding to a single signal path or bit of information. Thus, the data path 350-*b* may include r separate data sense amplifiers as part of the data path 350-*b*, where such data sense amplifiers may be distributed across the wing subblock circuitry 720-*a*-1 through 720-*a*-8. For example, each of the wing subblock circuitry 720-*a* may include r/8 data sense amplifiers, where the r/8 data sense amplifiers may be co-located in a region of a wing subblock 620, or may be distributed in different locations of a wing subblock 620. Each of the data sense amplifiers may be configured to be selectively coupled with one of a set of signal paths that correspond to memory cells 205 or digit lines 215 of at least two memory tiles 400. The data sense amplifiers may be an example of circuitry of a data path 350 that is associated with a single bit (e.g., of a quantity of bits).

Thus, the data path layout 700 illustrates an example of how a data path 350 may be distributed across a memory array 500 having a plurality of memory tiles 400. However, other data path layouts may include more, fewer, or different components, more, fewer, or different subcomponents, different distributions of components or subcomponents (e.g., in central subblocks, wing subblocks, or other subblocks), different quantities of bits, different distributions of bits, different granularities, different repetitions, different routing or multiplexing schemes, and other variations. In one illustrative example, an error correction component 370-*a*, or associated functionality, may be included in a set of error correction subcomponents that are located in a wing subblock 620 (e.g., of wing subblock circuitry 720). In such examples, central subblock circuitry 710 may include different components, or may be a pass-through subblock that provides signal routing between a single data path bus 351 and a set of intermediate buses 625. In some examples, central subblock circuitry 710 may receive control signaling over a control bus 266 and distribute such signaling (e.g., with or without further processing) to wing subblock circuitry 720. However, it should be noted that these and other techniques illustrate possible implementations, and that various components, subcomponents, multiplexing, or routing may be rearranged or otherwise modified and that other implementations are possible. Moreover, various examples described herein may be combined to provide further examples in accordance with the described techniques.

Thus, the described techniques support various examples for circuit partitioning for a memory device. For example, circuitry or functionality of a data path 350 may be distributed across memory tiles 400 of a memory array 500. The data path 350 may be associated with various levels of granularity or regularity, and in general may handle some number of bits (e.g., of information conveyed with a local memory controller 165 or 265) plus some number of management bits (e.g., parity bits, redundancy bits). In some examples, functionality of a data path 350 may be divided into a portion referred to as a "bit slice" that handles some quantity of bits (e.g., one data bit, a plurality of data bits). In an example where a data path 350 handles $2^n$ bits, some data paths may be configured with $2^n$ bit slices, or some other number of bit slices or subdivisions. In some examples, bit slices may be clustered or otherwise grouped of combined, such as clusters of 2 bit slices, 4 bit slices, 8 bit slices, 16 bit slices, 32 bit slices, 64 bit slices, and so on.

For example, for a data path 350 associated with a data path bus 351 configured for communicating 256 bits of information (e.g., where u=256), a bit slice may refer to one of the bits of information (e.g., one of the 256) or a bit slice may refer to one of the bits of information that supports such a data path bus 351 (e.g., one of r bits, such as one of 320 bits that support a 256-bit data path with 25% management overhead). Referring to the example of data path layout 700, where u=256 bits, t may be equal to 288 bits in a configuration that includes one bit-per-byte for error correction (e.g., of the error correction component 370-*a*). Thus, each of the wing subblock circuitry 720-*a* may be associated with an intermediate bus 625-*b* configured to convey 36 bits of information (e.g., t/8). In some examples, this may correspond to a wing subblock circuitry 720-*a* being associated with a group of 36 bit slices. Alternatively, because the data path layout 700 that is configured for u=256 bits is divided into eight repetitions of wing subblock circuitry 720-*a*, this may correspond to a wing subblock circuitry 720-*a* being associated with a group of 32 bit slices (e.g., 256 divided by 8). In an example where the data path layout 700 is configured for one bit-per-byte for redundancy repair (e.g., of the redundancy repair subcomponents 740-*a*), each of the wing subblock circuitry 720-*a* may be associated with a wing subblock bus 725-*a* configured to convey 40 bits of information (e.g., accessing 40 memory cells 205). In some examples, this may correspond to a wing subblock circuitry 720-*a* being associated with a group of 40 bit slices. Thus, a data path 350, or portions thereof, may be arranged according to different interpretations or combinations of bit slices.

Figure 8:
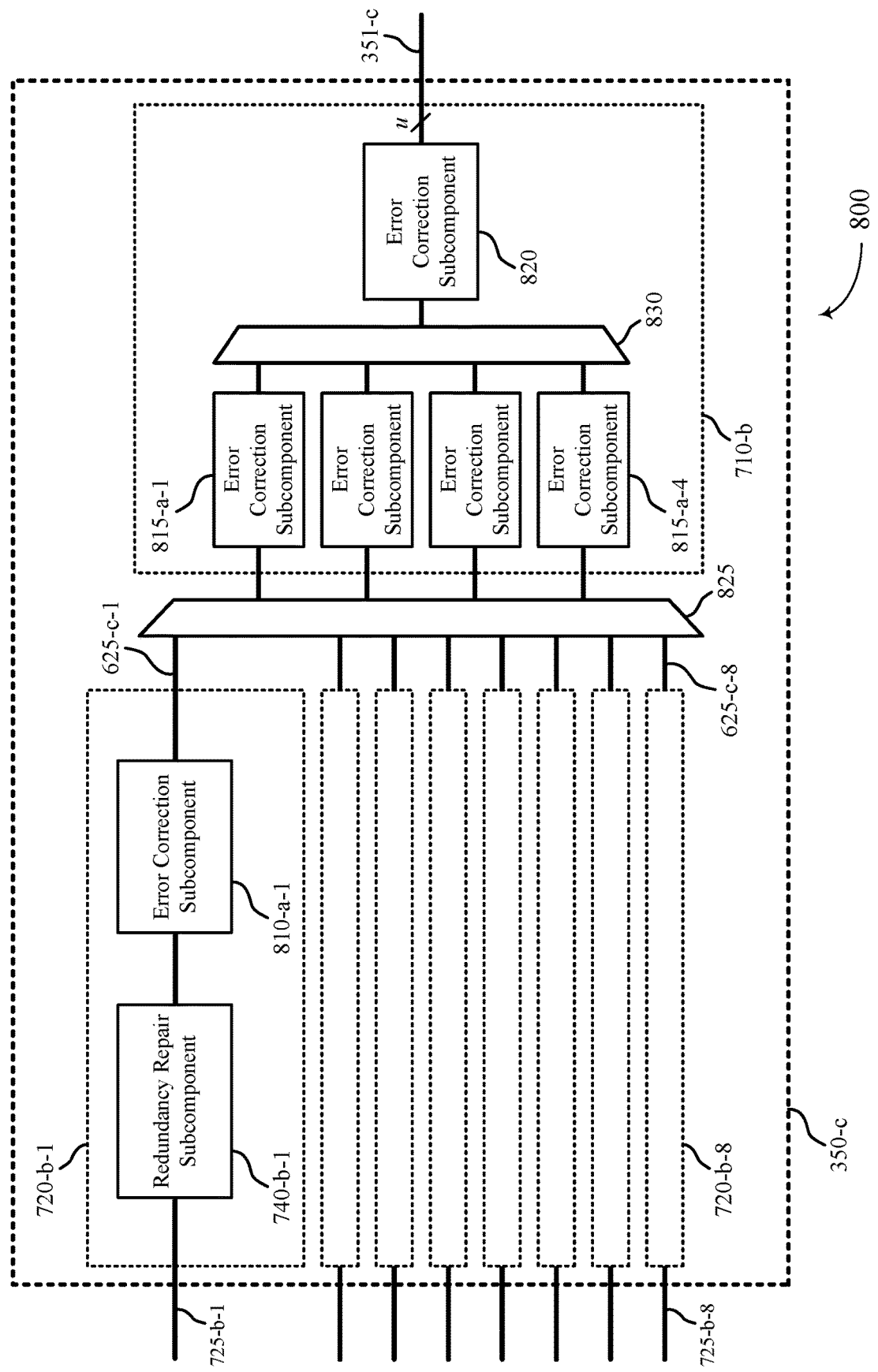

FIG. 8 illustrates an example of a data path layout 800 that supports circuit partitioning for a memory device in accordance with examples as disclosed herein. The data path layout 800 illustrates an example of a data path 350-c associated with a data path bus 351-c configured for u bits of information (e.g., as described with reference to FIG. 3). The data path layout 800 illustrates an example of distributing (e.g., dividing, arranging, partitioning) circuitry of the data path 350-c among central subblock circuitry 710-b and wing subblock circuitry 720-b (e.g., wing subblock circuitry 720-b-1 through 720-b-8).

The central subblock circuitry 710-b and wing subblock circuitry 720-b of the data path 350-c may be examples of aspects of central subblock circuitry 710 or wing subblock circuitry 720 described with reference to FIG. 7. For example, the central subblock circuitry 710-b illustrates an example of circuitry that may correspond to (e.g., be included within the illustrative boundary of) a central subblock of a memory array 500, such as a central subblock 610 described with reference to FIG. 6, and the wing subblock circuitry 720-b illustrates an example of circuitry that may correspond to (e.g., be included within the illustrative boundary of) a wing subblock of a memory section, such as a wing subblock 620 described with reference to FIG. 6. Each of the wing subblock circuitry 720-b may be in communication with the central subblock circuitry 710-b via a respective intermediate bus 625-c, which may be an example of the intermediate buses 625-a described with reference to FIG. 6.

In the example of data path 350-c, each of the wing subblock circuitry 720-b-1 through 720-b-8 may include a redundancy repair subcomponent 740-b (e.g., redundancy repair subcomponent 740-b-1 through 740-b-8, not shown), which may be examples of the redundancy repair subcomponents 740-a described with reference to FIG. 7. The redundancy repair subcomponents 740-b-1 through 740-b-8 may collectively be considered an example of, or otherwise perform the functions of a redundancy repair component 365 described with reference to FIG. 3. In some examples, the wing subblock circuitry 720-b-1 through 720-b-8 may include write driver circuitry, such as those described with reference to FIG. 3 (e.g., as respective write driver subcomponents in each instance of the wing subblock circuitry 720-b-1 through 720-b-8). In the example of data path layout 800, data sense amplifier subcomponents 730 are omitted from the wing subblock circuitry 720-b-1 through 720-b-8, but other examples may or may not include data sense amplifier subcomponents 730.

In the example of data path 350-c, subcomponents (e.g., of a component of the data path 350-c, corresponding to a function of the data path 350-c) are distributed across both central subblock circuitry 710 and wing subblock circuitry 720. For example, the data path 350-c includes a first set of error correction subcomponents 810-a (e.g., error correction subcomponents 810-a-1 through 810-a-8, not shown) located within or otherwise corresponding to the wing subblock circuitry 720-b, a second set of error correction subcomponents 815-a (e.g., error correction subcomponents 815-a-1 through 815-a-4) located within or otherwise corresponding to the central subblock circuitry 710-b, and another error correction subcomponent 820 located within or otherwise corresponding to the central subblock circuitry 710-b.

The first set of error correction subcomponents 810-a may be configured to be coupled with the second set of error correction subcomponents 815-a via a first error correction multiplexer 825, and the second set of error correction subcomponents 815-a may be configured to be coupled with the error correction subcomponent 820 via a second error correction multiplexer 830. In various examples, the first error correction multiplexer 825 or the second error correction multiplexer 830 may be configured for selective communication over various signal paths, or may be illustrative of fixed signal paths that connect the respective components. In some examples, one or more subcomponents or signal paths of the first error correction multiplexer 825 be located within or be otherwise associated with central subblock circuitry 710-b or wing subblock circuitry 720-b. The error correction subcomponents 810-a, error correction subcomponents 815-a, error correction subcomponent 820, first error correction multiplexer 825 and second error correction multiplexer 830 may collectively be considered an example of, or otherwise perform the functions of an error correction component 370 described with reference to FIG. 3. These components may be configured to communicate, in aggregate, t bits of information with the redundancy repair subcomponents 740-b to support the u bits of information of the data path bus 351-c. However, each instance of the wing subblock circuitry 720-b may or may not be configured to convey the same amount of information (e.g., each error correction subcomponent 810-a may or may not be configured to communicate t/8 bits of information with a respective redundancy repair subcomponent 740-b).

In one example, the data path 350-c may be configured for communicating 256 bits of information (e.g., where u=256), and the error correction subcomponents 810-a-1 through 810-a-8, the error correction subcomponents 815-a-1 through 815-a-4, and the error correction subcomponent 820 may collectively be configured to support 9 parity bits associated with the 256 bits of information (e.g., where t=265). In some examples, associating 256 bits of information transfer with 9 parity bits may support or otherwise correspond to a single error correction (SEC) functionality for the 256 bits of information. In some examples where a quantity of parity bits is not evenly divisible by a quantity of instances of wing subblock circuitry 720 (e.g., where the nine parity bits are not divisible, as an integer division, by eight instances of wing subblock circuitry 720-b in the data path 350-c), instances of redundancy repair subcomponents 740 or wing subblock circuitry 720 may be accordingly by configured to convey a different quantity of bits of information, or may be configured to convey bits of information that are used for different functions of a data path (e.g., parallel to or unrelated to error correction, unrelated to parity bits), or may be configured to convey bits of information that are not used in the data path 350-c.

The error correction subcomponents 810-a-1 through 810-a-8, the error correction subcomponents 815-a-1 through 815-a-4, and the error correction subcomponent 820 may correspond to different error correction operations, stages, or other aspects of syndrome or other error correction calculation. For example, the set of error correction subcomponents 810-a-1 through 810-a-8 may illustrate an example of circuitry that supports performing a first stage of error correction in each instance of wing subblock circuitry 720-b, and the set of error correction subcomponents 815-a-1 through 815-a-4 may illustrate an example of circuitry that supports performing a second stage of error correction in respective subcomponents of the central subblock circuitry 710-b (e.g., corresponding to two wing subblocks 620). The error correction subcomponent 820 may illustrate an example of circuitry that supports performing a third stage of error correction in a single component, corresponding to all of the bits of information transfer (e.g., u bits).

Thus, the error correction subcomponents 810-*a*-1 through 810-*a*-8, the error correction subcomponents 815-*a*-1 through 815-*a*-4, and the error correction subcomponent 820 may illustrate an example of distributing functionality of a data path 350 (e.g., functionality of an error correction component 370) into different regions of a data path layout according to different granularities.

In some examples, the buses or multiplexers between the error correction subcomponents 810-*a* and the error correction subcomponent 820 may be configured for bidirectional communication, such that results, outcomes, or other signaling may be passed from the error correction subcomponent 820 to the error correction subcomponents 810-*a* (e.g., via the error correction multiplexer 830, the error correction subcomponents 815-*a*, or the error correction multiplexer 825). For example, the error correction subcomponent 820 may convey signaling corresponding to or otherwise based on a calculated error correction syndrome back through or bypassing the error subcomponents 810-*a* (e.g., via respective write driver subcomponents) to support write or rewrite operations. In various examples, such operations may include write or rewrite operations that include parity bits or error-corrected information (e.g., error-corrected bits of information passed back to memory cells 205 of memory tiles 400, over tile path buses 725-*b*, to support error-corrected rewrite operations). In some examples, such signaling by the error correction subcomponent 820 may be independent of information transfer (e.g., following error correction at the error correction subcomponent 820) over the data path bus 351-*a*.

Figure 9:
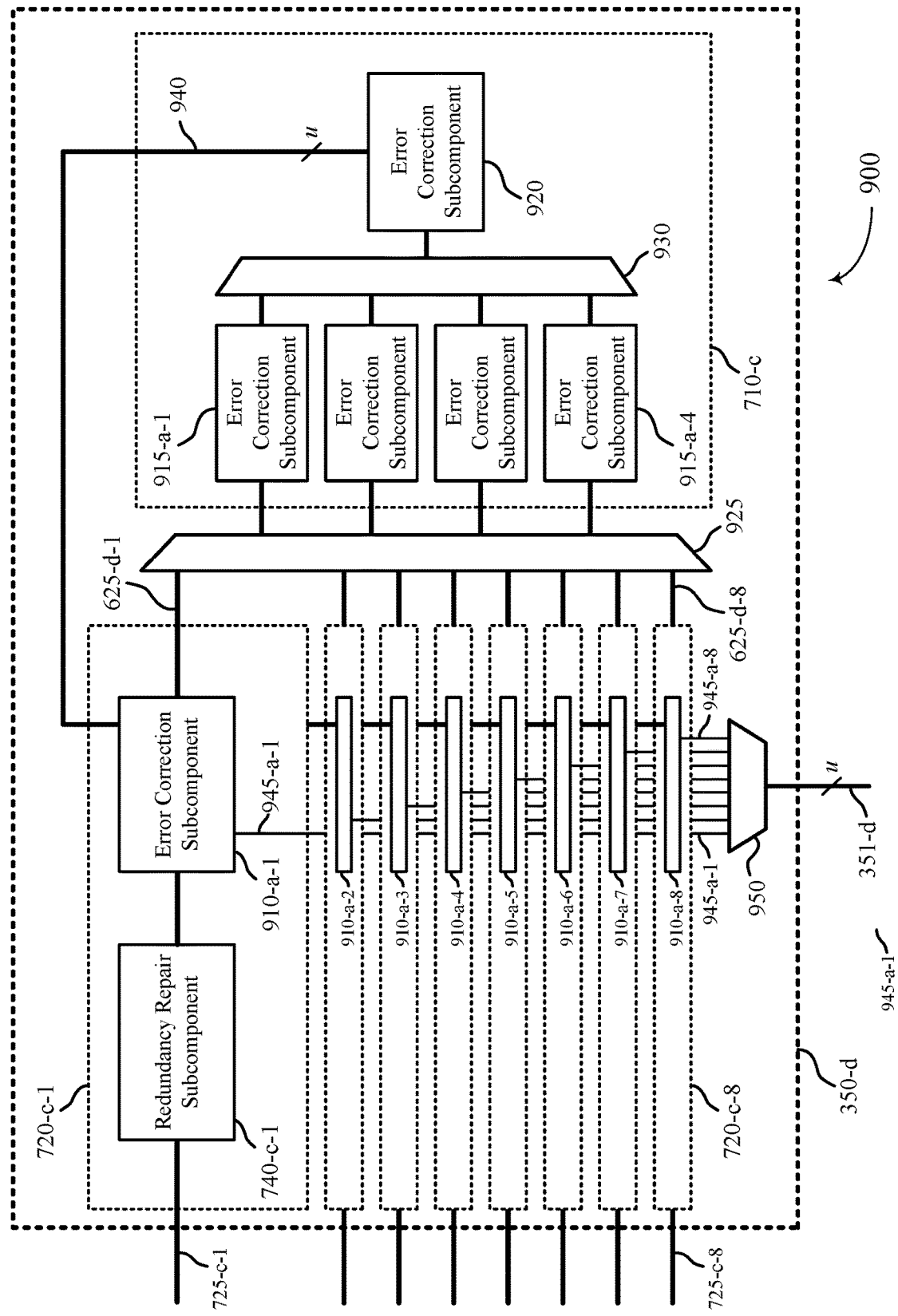

FIG. 9 illustrates an example of a data path layout 900 that supports circuit partitioning for a memory device in accordance with examples as disclosed herein. The data path layout 900 illustrates an example of a data path 350-*d* associated with a data path bus 351-*d* configured for u bits of information (e.g., as described with reference to FIG. 3). The data path layout 900 illustrates an example of distributing (e.g., dividing, arranging, partitioning) circuitry of the data path 350-*d* among central subblock circuitry 710-*c* and wing subblock circuitry 720-*c* (e.g., wing subblock circuitry 720-*c*-1 through 720-*c*-8).

The central subblock circuitry 710-*c* and wing subblock circuitry 720-*c* of the data path 350-*d* may be examples of aspects of central subblock circuitry 710 or wing subblock circuitry 720 described with reference to FIG. 7. For example, the central subblock circuitry 710-*d* illustrates an example of circuitry that may correspond to (e.g., be included within the illustrative boundary of) a central subblock of a memory array 500, such as a central subblock 610 described with reference to FIG. 6, and the wing subblock circuitry 720-*d* illustrates an example of circuitry that may correspond to (e.g., be included within the illustrative boundary of) a wing subblock of a memory section, such as a wing subblock 620 described with reference to FIG. 6. Each instance of the wing subblock circuitry 720-*d* may be in communication with the central subblock circuitry 710-*d* via a respective intermediate bus 625-*d*, which may be an example of the intermediate buses 625-*a* described with reference to FIG. 6.

In the example of data path 350-*d*, each of the wing subblock circuitry 720-*c*-1 through 720-*c*-8 may include a redundancy repair subcomponent 740-*c* (e.g., redundancy repair subcomponent 740-*c*-1 through 740-*c*-8, not shown), which may be examples of the redundancy repair subcomponents 740-*a* described with reference to FIG. 7. The redundancy repair subcomponents 740-*c*-1 through 740-*c*-8 may collectively be considered an example of, or otherwise perform the functions of a redundancy repair component 365 described with reference to FIG. 3. In some examples, the wing subblock circuitry 720-*c*-1 through 720-*c*-8 may include write driver circuitry, such as those described with reference to FIG. 3 (e.g., as respective write driver subcomponents in each instance of the wing subblock circuitry 720-*c*-1 through 720-*c*-8). In the example of data path layout 900, data sense amplifier subcomponents 730 are omitted from the wing subblock circuitry 720-*c*-1 through 720-*c*-8, but other examples may or may not include data sense amplifier subcomponents 730.

In the example of data path 350-*d*, subcomponents (e.g., of a component of the data path 350-*d*, corresponding to a function of the data path 350-*d*) are distributed across both central subblock circuitry 710-*c* and wing subblock circuitry 720. For example, the data path 350-*d* includes a first set of error correction subcomponents 910-*a* (e.g., error correction subcomponents 910-*a*-1 through 910-*a*-8) located within or otherwise corresponding to the wing subblock circuitry 720-*c*, a second set of error correction subcomponents 915-*a* (e.g., error correction subcomponents 915-*a*-1 through 915-*a*-4) located within or otherwise corresponding to the central subblock circuitry 710-*c*, and another error correction subcomponent 920 located within or otherwise corresponding to the central subblock circuitry 710-*c*.

The first set of error correction subcomponents 910-*a* may be configured to be coupled with the second set of error correction subcomponents 915-*a* via a first error correction multiplexer 925, and the second set of error correction subcomponents 915-*a* may be configured to be coupled with the error correction subcomponent 920 via a second error correction multiplexer 930. In various examples, the first error correction multiplexer 925 or the second error correction multiplexer 930 may be configured for selective communication over various signal paths, or may be illustrative of fixed signal paths that connect the respective components. In some examples, one or more subcomponents or signal paths of the first error correction multiplexer 925 be located within or be otherwise associated with central subblock circuitry 710-*c* or wing subblock circuitry 720-*c*. The error correction subcomponents 910-*a*, error correction subcomponents 915-*a*, error correction subcomponent 920, first error correction multiplexer 925 and second error correction multiplexer 930 may collectively be considered an example of, or otherwise perform functions of an error correction component 370 described with reference to FIG. 3. These components may be configured to communicate, in aggregate, t bits of information with the redundancy repair subcomponents 740-*c* to support the u bits of information of the data path bus 351-*d*. However, each instance of the wing subblock circuitry 720-*c* may or may not be configured to convey the same amount of information with the central subblock circuitry 710-*c* (e.g., each error correction subcomponent 910-*a* may or may not be configured to communicate t/8 bits of information with a respective redundancy repair subcomponent 740-*c*).

In one example, the data path 350-*d* may be configured for communicating 256 bits of information (e.g., where u=256), and the error correction subcomponents 910-*a*-1 through 910-*a*-8, the error correction subcomponents 915-*a*-1 through 915-*a*-4, and the error correction subcomponent 920 may collectively be configured to support 9 parity bits associated with the 256 bits of information (e.g., where t=265). In some examples, associating 256 bits of information transfer with 9 parity bits may support or otherwise correspond to a single error correction (SEC) functionality for the 256 bits of information. In some examples where a quantity of parity bits is not evenly divisible by a quantity of instances of wing subblock circuitry 720 (e.g., where the nine parity bits are not divisible, as an integer division, by eight instances of wing subblock circuitry 720-*c* in the data path 350-*d*), instances of redundancy repair subcomponents 740 or wing subblock circuitry 720 may be accordingly by configured to convey a different quantity of bits of information, or may be configured to convey bits of information that are used for different functions of a data path (e.g., parallel to or unrelated to error correction, unrelated to parity bits), or may be configured to convey bits of information that are not used in the data path 350-*d*.

The error correction subcomponents 910-*a*-1 through 910-*a*-8, the error correction subcomponents 915-*a*-1 through 915-*a*-4, and the error correction subcomponent 920 may correspond to different error correction operations, stages, or other aspects of syndrome or other error correction calculation. For example, the set of error correction subcomponents 910-*a*-1 through 910-*a*-8 may illustrate an example of circuitry that supports performing a first stage of error correction in each instance of wing subblock circuitry 720-*c*, and the set of error correction subcomponents 915-*a*-1 through 915-*a*-4 may illustrate an example of circuitry that supports performing a second stage of error correction in respective subcomponents of the central subblock circuitry 710-*c* (e.g., corresponding to two wing subblocks 620). The error correction subcomponent 920 may illustrate an example of circuitry that supports performing a third stage of error correction in a single component, corresponding to all of the bits of information transfer (e.g., u bits). Thus, the error correction subcomponents 910-*a*-1 through 910-*a*-8, the error correction subcomponents 915-*a*-1 through 915-*a*-4, and the error correction subcomponent 920 may illustrate an example of distributing functionality of a data path 350 (e.g., functionality of an error correction component 370) into different regions of a data path layout according to different granularities.

The example of data path 350-*d* may also illustrate an example of error correction that includes feedback functionality (e.g., feedback from the central subblock circuitry 710-*c* to the wing subblock circuitry 720-*c*, feedback from a data path-level granularity to a wing granularity). For example, the data path 350-*d* may include a feedback bus 940, configured to convey u bits of information between the error correction subcomponent 920 and the error correction subcomponents 910-*a*-1 through 910-*a*-8 (e.g., collectively), which may be a same quantity of bits conveyed by the data path bus 351-*d*. In other words, the data path 350-*d* illustrates an example of an error correction component 370 that includes a feedback bus 940.

In some examples, the quantity of bits conveyed by the feedback bus 940 may be evenly divisible by the quantity of instances of wing subblock circuitry 720-*c* (e.g., a quantity of error correction subcomponents 910-*a*). For example, when the feedback bus 940, the data path bus 351-*d*, or both are configured to communicate 256 bits of information, the feedback bus 940 may be configured to communicate 32 bits of information with each of the instances of wing subblock circuitry 720-*c* (e.g., each of the error correction subcomponents 910-*a*-1 through 910-*a*-8). In some examples, the feedback bus 940 may communicate error-corrected bits of information (e.g., following an error correction operation performed by the error correction subcomponent 920), which may be used by the error correction subcomponents 910-*a* to convey error-corrected bits back to memory cells 205 of a memory tile 400 (e.g., via one of the tile path buses 725-*c*-1 through 725-*c*-8, via a tile path 310).

For example, the error correction subcomponent 920 may convey signaling corresponding to or otherwise based on a calculated error correction syndrome over the feedback bus 940 to support write or rewrite operations. In various examples, such operations may include write or rewrite operations that include parity bits or error-corrected information (e.g., error-corrected bits of information passed back to memory cells 205 of memory tiles 400, over the tile path buses 725-*c*, to support error-corrected rewrite operations). In some examples, such signaling by the error correction subcomponent 920 may combined or otherwise conveyed with the shared purpose of supporting error-corrected information transfer over the data path bus 351-*a* (e.g., following a recombining of feed-through buses 945-*a*-1 through 945-*a*-8 at the data path multiplexer 950).

In some examples, error-corrected bits of information may be conveyed directly or indirectly from the feedback bus 940 to the data path bus 351-*d*. For example, each of the error correction subcomponents 910-*a*-1 through 910-*a*-8 may be configured to convey u/8 bits of information from the feedback bus 940 to a data path multiplexer 950 over a respective feed-through bus 945-*a* (e.g., feed-through bus 945-*a*-1 configured to convey u/8 bits of information between the error correction subcomponent 910-*a*-1 and the data path multiplexer 950, feed-through bus 945-*a*-2 configured to convey u/8 bits of information between the error correction subcomponent 910-*a*-2 and the data path multiplexer 950, and so on). In some examples, the bits of information conveyed by the feed-through buses 945-*a*-1 through 945-*a*-8, collectively, or the bits of information conveyed by the data path bus 351-*d*, may be the same as the bits of information conveyed by the feedback bus 940. In other examples, operations may be performed on one or more of the bits of information conveyed by the feedback bus 940 (e.g., by the error correction subcomponents 910-*a*) prior to being passed along a respective feed-through bus 945-*a*.

The data path multiplexer 950 may be configured for selective communication over various signal paths, or may be illustrative of fixed signal paths that connect the data path bus 351-*d* with the wing subblock circuitry 720-*c*-1 through 720-*c*-8 (e.g., a functional or illustrative combining of eight buses conveying u/8 bits of information into a single bus conveying u bits of information). In some examples, the feed-through buses 945-*a*, the data path multiplexer 950, or both may considered to be subcomponents of an error correction component 370 described with reference to FIG. 3. Although the data path multiplexer 950 is not illustrated as being part of either the central subblock circuitry 710-*c* or wing subblock circuitry 720-*c*, in some examples the data path multiplexer 950 may be part of the central subblock circuitry 710-*a*, such that the feed-through buses 945-*a* may be another example of intermediate buses 625 described with reference to FIG. 6 (e.g., in addition to the intermediate buses 625-*d*-1 through 625-*d*-8 of the data path 350-*d*). Additionally or alternatively, all or a portion of the data path multiplexer 950 may be distributed across wing subblock circuitry 720-*c*-1 through 720-*c*-8.

In another example, feed-through buses 945 and a data path multiplexer 950 may be omitted from a data path 350 that supports feedback functionality. In such examples, a feedback bus 940 may be similarly shared among the corresponding set of wing subblock circuitry 720 (e.g., as illustrated in the data path 350-*d*), but may pass out of the data path 350 either directly into a data path bus 351 or into a data path bus 351 via some other functional block or circuitry. In other examples, a feedback bus 940 and a data path bus 351 may be equivalent (e.g., a common bus supporting the shared purpose of feedback signaling and data path signaling).

The described techniques for circuit partitioning in a memory device may provide various advantages for layout, signaling, production, or performance of a memory device. For example, the described techniques may support having a regular layout provided by a repetition of relatively few blocks (e.g., memory tiles 400, memory arrays 500). Further, the described techniques may support advantages for various signal routing, such as reducing a number of conductive paths, sub-levels, or sub-layers of a routing level (e.g., a routing level 420, a routing level 425). In some examples, the described techniques may support reducing certain types of routing levels or routing levels of a particular material, such as limiting a reliance on routing signal paths made of tungsten, or reducing a reliance on socket connectors to provide signal routing. In some examples, the described techniques may support a more even distribution of power sources (e.g., voltage sources, current sources), which may include a more even distribution of a power delivery network load. In some examples, the described techniques may improve power gating, re-bufferization, or efficiency, and may provide between timing matching or less skew (e.g., across a memory array 500), such as when a central sub-block 610 is located in the middle of a group of wing subblocks 620.

An apparatus is described. The apparatus may include a set of memory tiles, each memory tile of the set of memory tiles including an array level including a set of memory cells, and a circuit level including circuitry corresponding to the set of memory cells. The apparatus may also include data path circuitry corresponding to the set of memory tiles, where the data path circuitry may be configured to transfer information associated with access operations for the set of memory tiles. The data path circuitry may be located in (e.g., distributed across) the circuit level of two or more memory tiles of the set of memory tiles.

In some examples, the configuration to transfer information is associated with a quantity of bits of information transfer. In such examples, the data path circuitry may include a first subset of circuitry associated with all of the quantity of bits of data transfer, and a second subset of circuitry including a set of circuit portions, each circuit portion of the set associated with a respective subset of the quantity of bits, and each circuit portion of the set distributed across the circuit layer of a respective subset of the set of memory tiles.

In some examples, the data path circuitry may include a third subset of circuitry including a set of second circuit portions, each second circuit portion of the set being associated with a single bit (e.g., a single one of the quantity of bits).

In some examples, the second subset of circuitry may be configured to couple each of the set of circuit portions to an array level of a different one of the set of memory tiles.

In some examples, the second subset of circuitry may be configured to couple all of the set of circuit portions to an array level of a same one of the set of memory tiles.

In some examples, the first subset of circuitry may be located between a first portion of the second subset of circuitry and a second portion of the second subset of circuitry.

In some examples, each of the memory cells includes a cell selection component and a capacitive memory element.

In some examples, each of the memory cells includes a configurable material memory element.

In some examples, for each of the set of memory tiles, the respective array level includes a first set of access lines and a second set of access lines, each of the memory cells of the respective array level being coupled with one of the first set of access lines and one of the second set of access lines.

In some examples, for each of the set of memory tiles, the respective array level includes an electrical node that is common to at least a subset of the set of memory cells of the respective array level.

In some examples, for each of the set of memory tiles, the circuitry corresponding to the set of memory cells of the respective memory tile includes decoder circuitry for accessing the set of memory cells of the respective memory tile.

In some examples, for each of the set of memory tiles, the circuitry corresponding to the set of memory cells of the respective memory tile includes sensing circuitry configured to detect logic states stored by the respective set of memory cells of the respective memory tile.

In some examples, the circuitry corresponding to the set of memory cells is configured to generate first signals corresponding to a set of logic states and having a first voltage swing, and the data path circuitry includes circuitry configured to amplify the first signals to generate second signals corresponding to the set of logic states and having a second voltage swing that is greater than the first voltage swing.

In some examples, the data path circuitry corresponding to the set of memory tiles includes redundancy repair circuitry.

In some examples, the data path circuitry corresponding to the set of memory tiles includes error correction circuitry.

In some examples, the data path circuitry corresponding to the set of memory tiles includes error detection circuitry.

In some examples, for each of the set of memory tiles, the respective circuit level may be between the respective array layer and a substrate.

In some examples, each of the set of memory tiles includes one or more routing levels.

In some examples, for each of the set of memory tiles, the one or more routing levels include a routing level between the array level of the respective memory tile and the circuit level of the respective memory tile.

In some examples, for each of the set of memory tiles, the one or more routing level include a routing level on an opposite side of the array level from the circuit level of the respective memory tile.

In some examples, for each of the set of memory tiles, the one or more routing levels include a routing level between the array level of the respective memory tile and the circuit level of the respective memory tile.

An apparatus is described. The apparatus may include a set of memory tiles that each include: an array layer having a set of memory cells and a set of access lines; and a circuit layer that includes decoder circuitry configured to selectively access the set of memory cells via the set of access lines and sensing circuitry configured to detect logic states stored by the set of memory cells. The apparatus may also include data path circuitry corresponding to the set of memory tiles and configured to process data communicated between the set of memory tiles and an input/output component of the apparatus, where the data path circuitry is distributed across the circuit layer of two or more memory tiles of the plurality of memory tiles.

In some examples, the data path circuitry may be configured to transfer a quantity of bits for access operations, and the data path circuitry may include: a first subset of circuitry associated with all of the quantity of bits; and a second subset of circuitry comprising a set of circuit portions, each circuit portion of the set associated with a respective subset of the quantity of bits, and each circuit portion of the set distributed across the circuit layer of a respective subset of the set of memory tiles.

In some examples, the sensing circuitry may be configured to generate first signals corresponding to a set of logic states and having a first voltage swing, and the data path circuitry may include circuitry configured to amplify the first signals to generate second signals corresponding to the set of logic states and having a second voltage swing that is greater than the first voltage swing.

In some examples, the data path circuitry corresponding to the set of memory tiles may include redundancy repair circuitry, error correction circuitry, error detection circuitry, or a combination thereof.

An apparatus is described. The apparatus may include a set of memory tiles that each comprise a respective array of memory cells, wherein each of the set of memory tiles includes a respective circuit layer having circuitry configured to operate the respective array of memory cells, and circuitry for communicating data between the memory cells of the set of memory tiles and an input/output component, the circuitry for communicating the data distributed across the circuit layer of two or more of the set of memory tiles.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a substrate;
a plurality of memory tiles over the substrate, each memory tile of the plurality of memory tiles associated with a respective cross-sectional area over the substrate and comprising:
an array level of the memory tile associated with the respective cross-sectional area and located at a first distance relative to the substrate, the array level comprising a plurality of memory cells; and
a circuit level of the memory tile associated with the respective cross-sectional area and located at a second distance relative to the substrate that is nearer to or farther from the substrate than the first distance, the circuit level comprising a first area and a second area different than the first area, the first area comprising circuitry corresponding to the plurality of memory cells; and
data path circuitry corresponding to the plurality of memory tiles, wherein the data path circuitry is configured to transfer information associated with access operations for the plurality of memory tiles, and wherein the data path circuitry is located in the second areas of the circuit level of two or more memory tiles of the plurality of memory tiles.

2. The apparatus of claim 1, wherein the configuration to transfer information is associated with a quantity of bits of information transfer, and wherein the data path circuitry comprises:
a first subset of circuitry associated with all of the quantity of bits; and
a second subset of circuitry comprising a plurality of circuit portions, each circuit portion of the plurality associated with a respective subset of the quantity of bits, and each circuit portion of the plurality distributed across the circuit level of a respective subset of the plurality of memory tiles.

3. The apparatus of claim 2, wherein the data path circuitry further comprises:
a third subset of circuitry comprising a plurality of second circuit portions, each second circuit portion of the plurality being associated with a single one of the quantity of bits.

4. The apparatus of claim 2, wherein the second subset of circuitry is configured to couple each of the plurality of circuit portions to the array level of a different one of the plurality of memory tiles.

5. The apparatus of claim 2, wherein the second subset of circuitry is configured to couple all of the plurality of circuit portions to the array level of a same one of the plurality of memory tiles.

6. The apparatus of claim 2, wherein the first subset of circuitry is located between a first portion of the second subset of circuitry and a second portion of the second subset of circuitry.

7. The apparatus of claim 1, wherein each of the memory cells comprises a cell selection component and a capacitive memory element.

8. The apparatus of claim 1, wherein each of the memory cells comprises a configurable material memory element.

9. The apparatus of claim 1, wherein, for each of the plurality of memory tiles, the respective array level comprises a first plurality of access lines and a second plurality of access lines, each of the memory cells of the respective array level being coupled with one of the first plurality of access lines and one of the second plurality of access lines.

10. The apparatus of claim 1, wherein, for each of the plurality of memory tiles, the respective array level comprises an electrical node that is common to at least a subset of the plurality of memory cells of the respective array level.

11. The apparatus of claim 1, wherein, for each of the plurality of memory tiles, the circuitry corresponding to the plurality of memory cells of the respective memory tile comprises decoder circuitry for accessing the plurality of memory cells of the respective memory tile.

12. The apparatus of claim 1, wherein, for each of the plurality of memory tiles, the circuitry corresponding to the plurality of memory cells of the respective memory tile comprises sensing circuitry configured to detect logic states stored by the plurality of memory cells of the respective memory tile.

13. The apparatus of claim 1, wherein the circuitry corresponding to the plurality of memory cells is configured to generate first signals corresponding to a set of logic states and having a first voltage swing, and wherein the data path circuitry comprises circuitry configured to amplify the first signals to generate second signals corresponding to the set of logic states and having a second voltage swing that is greater than the first voltage swing.

14. The apparatus of claim 1, wherein the data path circuitry corresponding to the plurality of memory tiles comprises redundancy repair circuitry.

15. The apparatus of claim 1, wherein the data path circuitry corresponding to the plurality of memory tiles comprises error correction circuitry.

16. The apparatus of claim 1, wherein the data path circuitry corresponding to the plurality of memory tiles comprises error detection circuitry.

17. The apparatus of claim 1, wherein, for each of the plurality of memory tiles, the respective circuit level is between the respective array level and the substrate.

18. The apparatus of claim 1, wherein each of the plurality of memory tiles comprises one or more routing levels.

19. The apparatus of claim 18, wherein, for each of the plurality of memory tiles, the one or more routing levels comprise a routing level between the array level of the respective memory tile and the circuit level of the respective memory tile.

20. The apparatus of claim 18, wherein, for each of the plurality of memory tiles, the one or more routing levels comprise a routing level on an opposite side of the array level from the circuit level of the respective memory tile.

21. An apparatus, comprising:
a substrate;
a plurality of memory tiles over the substrate, each memory tile of the plurality of memory tiles comprising:
an array layer of the memory tile located at a first distance relative to the substrate, the array layer comprising a plurality of memory cells and a plurality of access lines; and
a circuit layer of the memory tile located at a second distance relative to the substrate that is nearer to or farther from the substrate than the first distance, the circuit layer comprising a first area and a second area different than the first area, the first area comprising decoder circuitry configured to selectively access the plurality of memory cells via the plurality of access lines and sensing circuitry configured to detect logic states stored by the plurality of memory cells; and
data path circuitry corresponding to the plurality of memory tiles and configured to process data communicated between the plurality of memory tiles and an input/output component of the apparatus, wherein the data path circuitry is distributed across the second area of the circuit layer of two or more memory tiles of the plurality of memory tiles.

22. The apparatus of claim 21, wherein the data path circuitry is configured to transfer a quantity of bits for access operations, the data path circuitry comprising:
a first subset of circuitry associated with all of the quantity of bits; and
a second subset of circuitry comprising a plurality of circuit portions, each circuit portion of the plurality associated with a respective subset of the quantity of bits, and each circuit portion of the plurality distributed across the circuit layer of a respective subset of the plurality of memory tiles.

23. The apparatus of claim 21, wherein the sensing circuitry is configured to generate first signals corresponding to a set of logic states and having a first voltage swing, and wherein the data path circuitry comprises circuitry configured to amplify the first signals to generate second signals corresponding to the set of logic states and having a second voltage swing that is greater than the first voltage swing.

24. The apparatus of claim 21, wherein the data path circuitry corresponding to the plurality of memory tiles comprises redundancy repair circuitry, error correction circuitry, error detection circuitry, or a combination thereof.

25. An apparatus, comprising:
a substrate;
a plurality of memory tiles over the substrate that each comprise a respective array of memory cells, wherein each of the plurality of memory tiles comprises a respective circuit layer located nearer to or farther from the substrate than the respective array of memory cells, the circuit layer comprising a first area and a second area different than the first area, the first area comprising circuitry configured to operate the respective array of memory cells; and
circuitry for communicating data between the memory cells of the plurality of memory tiles and an input/output component, the circuitry for communicating the data distributed across the second area of the circuit layer of two or more of the plurality of memory tiles.

* * * * *